(12) United States Patent
Nakadaira et al.

(10) Patent No.: US 10,580,988 B2
(45) Date of Patent: Mar. 3, 2020

(54) DISPLAY UNIT AND METHOD OF MANUFACTURING DISPLAY UNIT

(71) Applicant: JOLED Inc., Tokyo (JP)

(72) Inventors: Tadakatsu Nakadaira, Tokyo (JP);
Toshiki Matsumoto, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/485,465

(22) Filed: Apr. 12, 2017

(65) Prior Publication Data

US 2017/0222149 A1 Aug. 3, 2017

Related U.S. Application Data

(63) Continuation of application No. PCT/JP2015/065169, filed on May 27, 2015.

(30) Foreign Application Priority Data

Nov. 27, 2014 (JP) ................................. 2014-240107

(51) Int. Cl.
| | |
|---|---|
| *H01L 51/00* | (2006.01) |
| *H05B 33/28* | (2006.01) |
| *H01L 27/32* | (2006.01) |
| *H01L 51/52* | (2006.01) |
| *H01L 51/56* | (2006.01) |

(52) U.S. Cl.
CPC ...... *H01L 51/0023* (2013.01); *H01L 27/3276* (2013.01); *H01L 51/5234* (2013.01); *H01L 51/5253* (2013.01); *H01L 51/56* (2013.01); *H05B 33/28* (2013.01); *H01L 27/3244* (2013.01); *H01L 2251/568* (2013.01)

(58) Field of Classification Search
None
See application file for complete search history.

(56) References Cited

U.S. PATENT DOCUMENTS

2011/0121346 A1* 5/2011 Yamada ............... H01L 51/5234
257/98
2015/0115251 A1 4/2015 Jinta et al.

FOREIGN PATENT DOCUMENTS

| JP | 2005340149 A | 12/2005 |
|---|---|---|
| JP | 201588319 A | 5/2015 |
| WO | 2016084408 A1 | 6/2016 |

OTHER PUBLICATIONS

International Search Report dated Aug. 11, 2015 for PCT/JP2015/065169.

* cited by examiner

*Primary Examiner* — Matthew L Reames
*Assistant Examiner* — Steven B Gauthier
(74) *Attorney, Agent, or Firm* — Xsensus, LLP

(57) ABSTRACT

A display unit includes a first electrode, an organic layer, and a second electrode. The first electrode, the organic layer, and the second electrode are provided in this order on a substrate. The organic layer includes a light-emitting layer. The second electrode includes, in order from the organic layer, a first electrically conductive film, a high-resistivity layer, and a second electrically conductive film. The first electrically conductive film is transparent and includes an insulated or ablated local part. The high-resistivity layer has higher electric resistance than the first electrically conductive film. The second electrically conductive film is provided on the high-resistivity layer.

20 Claims, 25 Drawing Sheets

DISPLAY UNIT AND METHOD OF MANUFACTURING DISPLAY UNIT

CROSS REFERENCE TO RELATED APPLICATIONS

This is a continuation of International Application No. PCT/JP2015/065169, filed May 27, 2015, which claims the benefit of Japanese Priority Patent Application JP2014-240107, filed Nov. 27, 2014, the entire contents of both of which are incorporated herein by reference.

BACKGROUND

The disclosure relates to a display unit such as an organic electroluminescence (EL) display unit, and a method of manufacturing such a display unit.

In the technical field of a display unit that performs image display, development has recently been made in a display unit (organic EL display unit) using, as a light-emitting device, a current-driven optical device having emission luminance that varies in response to a value of a flowing current, e.g., an organic EL device, with commercialization thereof in progress. The light-emitting device is a self-emitting device unlike devices such as a liquid crystal device, thus making it unnecessary to provide a light source, i.e., a backlight separately. Therefore, the organic EL display unit has features of allowing for higher visibility of an image, less power consumption, and higher response rate of a device than a liquid crystal display unit that needs a light source.

Such a display device has a structure of interposing a light-emitting layer (organic electroluminescent layer) between electrodes, i.e., between an anode and a cathode. When a foreign matter is mixed in the organic layer during a manufacturing process, however, a short path is generated between electrodes due to the mixing of the foreign matter, causing a display defect referred to as a so-called dark spot. Under such circumstances, there has been proposed a repairing method for cutting the short path, as disclosed in Japanese Unexamined Patent Application Publication (JP-A) No. 2005-340149, for example.

SUMMARY

A method of the above-mentioned JP-A No. 2005-340149 involves applying a reverse bias between electrodes to ablate an electrode material with heat generation due to a reverse bias current. This allows for breakage or insulation of a portion where the short path is generated, thus enabling a dark spot portion to be repaired. Here, a transparent electrically conductive film to be used for an electrode may preferably be a thick film in order to have lower resistance, because use of the thick transparent electrically conductive film makes it possible to suppress deterioration in display image quality caused by so-called voltage drop. In the case of an electrode configured by a thick film, however, it is difficult to repair the dark spot caused by the reverse bias application as described above.

Thus, it has been expected to provide a display unit that makes it possible to both achieve suppression of the voltage drop due to lower resistance of an electrode and repair of the dark spot caused by a foreign matter, thus suppressing the deterioration in display image quality.

It is desirable to provide a display device that makes it possible to suppress the deterioration in display image quality and a method of manufacturing the display unit.

A first display unit according to an embodiment of the disclosure includes a first electrode, an organic layer, and a second electrode. The first electrode, the organic layer, and the second electrode are provided in this order on a substrate. The organic layer includes a light-emitting layer. The second electrode includes, in order from the organic layer, a first electrically conductive film, a high-resistivity layer, and a second electrically conductive film. The first electrically conductive film is transparent and includes an insulated or ablated local part. The high-resistivity layer has higher electric resistance than the first electrically conductive film. The second electrically conductive film is provided on the high-resistivity layer.

A first method of manufacturing a display unit according to an embodiment of the disclosure includes forming a first electrode, forming an organic layer including a light-emitting layer, and forming a second electrode. The first electrode, the organic layer, and the second electrode are formed in this order on a substrate. The forming of the second electrode includes forming a first electrically conductive film that is transparent, applying a reverse bias between the first electrode and the first electrically conductive film to repair a dark spot portion after the forming of the first electrically conductive film, forming, on the first electrically conductive film with the dark spot portion being repaired, a high-resistivity layer having higher electric resistance than the first electrically conductive film, and forming a second electrically conductive film on the high-resistivity layer.

A second display unit according to an embodiment of the disclosure includes a first electrode, an organic layer, and a second electrode. The first electrode, the organic layer, and the second electrode are provided in this order on a substrate. The organic layer includes a light-emitting layer. The second electrode includes a first electrically conductive film and a wiring line layer in order from the organic layer. The first electrically conductive film is transparent and includes an insulated or ablated local part. The wiring line layer is provided on the first electrically conductive film.

A second method of manufacturing a display unit according to an embodiment of the disclosure includes forming a first electrode, forming an organic layer including a light-emitting layer, and forming a second electrode. The first electrode, the organic layer, and the second electrode are formed in this order on a substrate. The forming of the second electrode includes forming a first electrically conductive film that is transparent, applying a reverse bias between the first electrode and the first electrically conductive film to repair a dark spot portion after the forming of the first electrically conductive film, and forming a wiring line layer after the repair of the dark spot portion.

A third method of manufacturing a display unit according to an embodiment of the disclosure includes forming a first electrode, forming an organic layer including a light-emitting layer, and forming a second electrode. The first electrode, the organic layer, and the second electrode are formed in this order on a substrate. The forming of the second electrode includes forming a third electrically conductive film that is semitransparent, forming a first electrically conductive film that is transparent after the forming of the third electrically conductive film, and applying a reverse bias between the first electrode and the third electrically conductive film or between the first electrode and the first electrically conductive film either before or after, or both before and after the forming of the first electrically conductive film to repair a dark spot portion. The forming of the second electrode is followed by forming a protective film on the second electrode. The forming of the protective film is followed by performing laser light irradiation to repair the dark spot portion.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the technology.

DETAILED DESCRIPTION

Some example embodiments of the disclosure are described below in detail, in the following order, with reference to the accompanying drawings.

1. First Embodiment (An example of a display unit in which a second electrode has a layered structure of first electrically conductive film/high-resistivity layer/second electrically conductive film)

2. Second Embodiment (An example of a display unit in which the second electrode has a layered structure of fourth electrically conductive film/first electrically conductive film/high-resistivity layer/second electrically conductive film)

3. Third Embodiment (An example where the high-resistivity layer is patterned)

4. Fourth Embodiment (An example of a display unit in which the second electrode has a layered structure of fourth electrically conductive film/first electrically conductive film)

5. Fifth Embodiment (An example of a display unit in which the second electrode has a layered structure of fourth electrically conductive film/first electrically conductive film/wiring line layer)

6. Sixth Embodiment (An example of a display unit in which the second electrode has a layered structure of first electrically conductive film/wiring line layer)

7. Modification Example (Another layering example of the second electrode)

8. Application Examples (Examples of electronic apparatuses)

First Embodiment

[Configuration]

Figure 1:
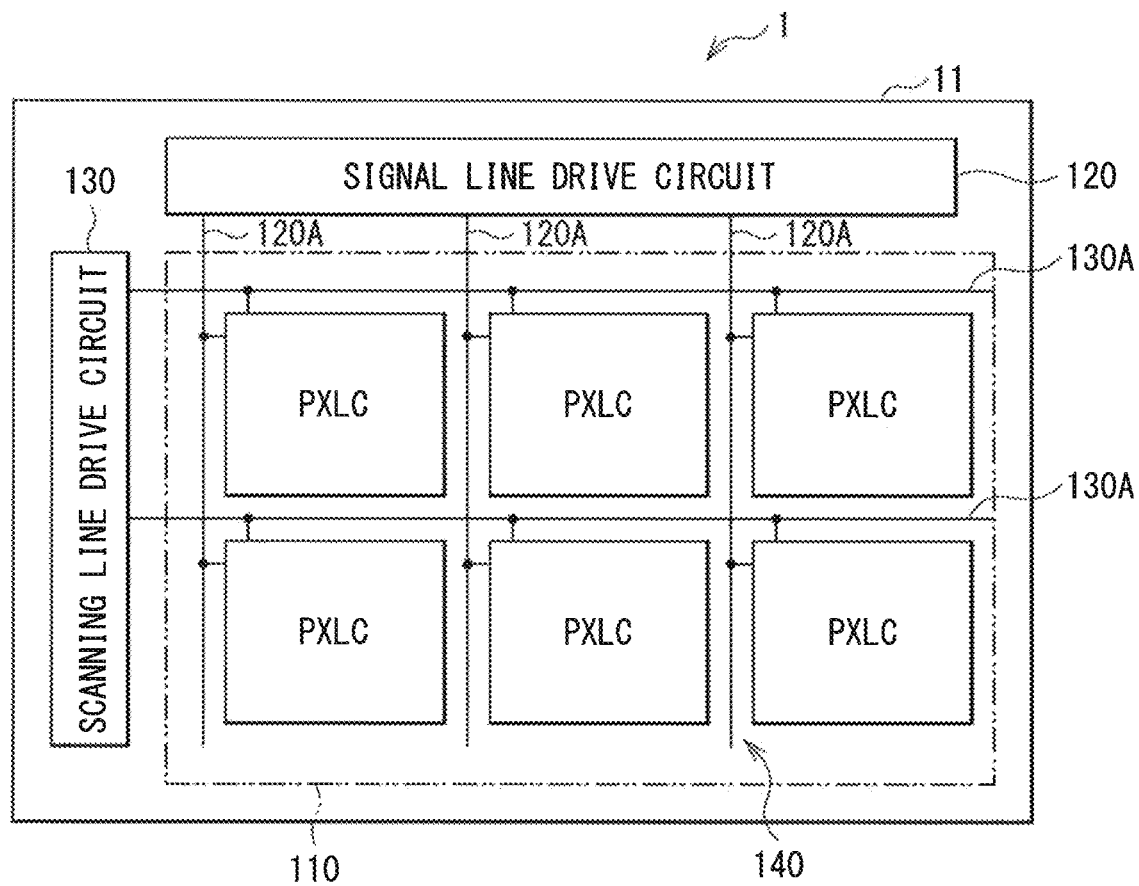
FIG. 1 illustrates a configuration of a display unit according to a first embodiment of the disclosure.

FIG. 1 illustrates a configuration of a display unit (display unit 1) according to a first embodiment of the disclosure. The display unit 1 may be an organic EL display unit, for example. In a display region 110 on a substrate 11, a plurality of pixels (subpixels) PXLCs may be disposed in matrix, for example. The pixels PXLCs each including an organic EL device 10A generate, for example, red light LR (wavelength from 620 nm to 750 nm), green light LG (wavelength from 495 nm to 570 nm), blue light LB (wavelength from 450 nm to 495 nm), and white light LW, respectively. Here, description is given of a case, as an example, where one pixel is configured by a set of the four types of pixels PXLCs (R pixel, G pixel, B pixel, and W pixel). A signal line drive circuit 120 and a scanning line drive circuit 130 may be provided on the periphery of the display region 110.

Figure 2:
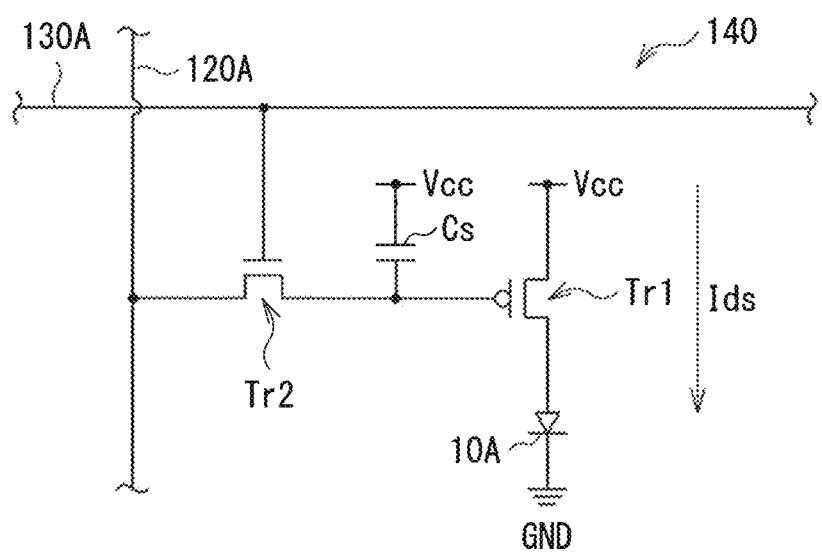
FIG. 2 is a circuit diagram illustrating an example of a pixel drive circuit illustrated in FIG. 1.

An active drive circuit (pixel drive circuit 140), for example, may be provided inside the display region 110. As illustrated in FIG. 2, the pixel drive circuit 140 may include a drive transistor Tr1 and a write transistor Tr2, and a holding capacitor Cs may be provided between these transistors Tr1 and Tr2. The organic EL device 10A may be coupled in series to the transistor Tr1 between a first power supply line (Vcc) and a second power supply line (GND). The signal line drive circuit 120 may supply an image signal to source electrodes of the respective transistors Tr2 through a plurality of signal lines 120A arranged in a column direction. The scanning line drive circuit 130 may supply a scanning signal sequentially to gate electrodes of the respective transistor Tr2 through a plurality of scanning lines 130A arranged in a row direction.

Figure 3:
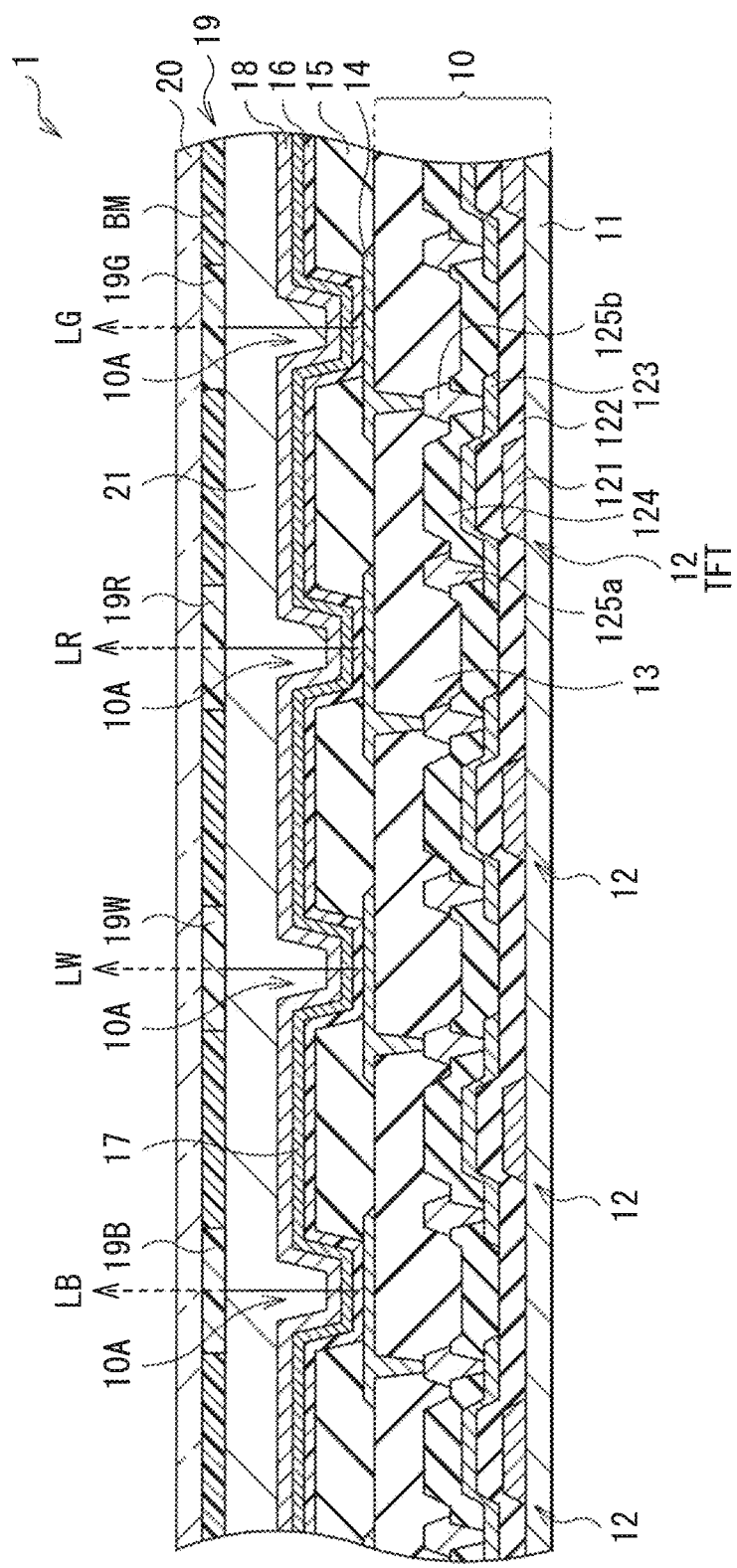
FIG. 3 is a cross-sectional view of a configuration of the display unit illustrated in FIG. 1.

FIG. 3 illustrates a cross-sectional configuration of the display unit illustrated in FIG. 1. It is to be noted that FIG. 3 illustrates regions corresponding to the above-described pixels PXLCs of four colors. The display unit 1 may be, for example, a so-called top emission (top surface emission) organic EL display in which light generated in the organic EL device 10A is extracted upward above a sealing substrate 20. Further, the organic EL device 10A may have a device structure to emit white light. The white light emitted from each of the organic EL devices 10A may pass through color filters 19 (19R, 19G, 19B, and 19W), thus causing the above-mentioned red light LR, green light LG, blue light LB, and white light LW to be outputted.

The organic EL device 10A may be provided between a drive substrate 10 and the sealing substrate 20. In the drive substrate 10, the pixel drive circuit 140 that drives each of the organic EL devices 10A may be provided on the substrate 11. It is to be noted that FIG. 3 indicates only a TFT 12 corresponding to the transistor Tr1. A surface of the drive substrate 10 may be covered with a planarization layer 13. A first electrode 14 as an anode, for example, may be provided on the planarization layer 13. The first electrode 14 may be electrically coupled to the TFT 12 provided on the drive substrate 10.

The organic EL device 10A may have a configuration in which the first electrode 14, a bank (pixel insulating film) 15, an organic layer 16 including a light-emitting layer, and a second electrode 17, for example, as a cathode are stacked in order from the drive substrate 10. A protective film 18 may be provided on the second electrode 17. The sealing substrate 20 may be jointed onto the protective film 18, with an adhesive layer 21 being interposed therebetween. A color filter layer 19 including color filters 19R, 19G, 19B, and 19W, and a black matrix layer BM may be provided on the sealing substrate 20. In the color filter layer 19, the black matrix layer BM may be provided in a lattice manner, and the color filters 19R, 19G, 19B, and 19W may be provided in respective lattice-shaped openings of the black matrix layer BM.

Description is given below of a configuration of each component of the display unit 1.

The substrate 11 may be made of a material such as glass, silicon (Si), and resin.

The TFT 12 may be, for example, a bottom gate thin film transistor (TFT), and may be configured by a metal oxide semiconductor field effect transistor (MOSFET), for example. In the TFT 12, for example, a gate electrode 121 that is pattern-formed through an insulating film, a gate insulating film 122, a semiconductor thin film 123 that forms a channel, and an interlayer insulating film 124 may be stacked in this order on the substrate 11. A source electrode 125a and a drain electrode 125b may be provided on both respective ends of the semiconductor thin film 123. The first electrode 14 may be electrically coupled to the drain electrode 125b. It is to be noted that the TFT 12 is not limited to such a bottom gate TFT; the TFT 12 may also be a top gate TFT. Further, the TFT 12 may be made of, for example, crystalline silicon or amorphous silicon. Alternatively, the TFT 12 may also be made of an oxide semiconductor.

The planarization layer 13 may be provided for planarizing a surface of the drive substrate 10 to allow the respective layers of the organic EL devices 10A to have a uniform film thickness. Examples of the constituent material of the planarization layer 13 may include an organic material such as polyimide resin, acrylic resin, and novolac resin; and an inorganic material such as silicon oxide ($SiO_2$), silicon nitride ($SiN_x$), and silicon oxynitride (SiON).

The first electrodes 14 may be provided for respective pixels and electrically separated from one another. The first electrode 14 may have light reflectivity, for example, and may preferably have as high reflectance as possible in terms of enhancing light-emitting efficiency. In addition, the first electrode 14 may preferably be made of a material having a high hole injection property in consideration of the use of the first electrode 14 as an anode. Examples of the constituent material of the first electrode 14 may include a metal simple substance such as chromium (Cr), gold (Au), platinum (Pt), nickel (Ni), copper (Cu), molybdenum (Mo), tungsten (W), titanium (Ti), tantalum (Ta), and silver (Ag), and an alloy thereof.

The bank 15 may be provided for electrically separating the first electrodes 14 from one another in respective pixels, and for securing an insulating property between the first electrode 14 and the second electrode 17. The bank 15 may have an opening in a selective region facing each of the first electrode 14, to form respective light-emitting regions of the organic EL devices 10A. The bank 15 may be made of, for example, an insulating material such as silicon oxide, polyimide, and a photosensitive resin.

The organic layer 16 includes a light-emitting layer (organic electroluminescent layer). In this example, the organic layer 16 may be a white light-emitting layer that is common to the organic EL devices 10A. However, the organic layer 16 may also include, in addition to the light-emitting layer, a hole transport layer (HTL), a hole injection layer (HIL), and an electron transport layer (ETL), for example. Further, an electron injection layer (EIL) such as lithium fluoride (LiF) may also be provided between the organic layer 16 and the second electrode 17.

The second electrode 17 may have light-transmissivity, and may be so provided across the entire surface of the display region as to be common to the respective organic EL devices 10A in this example. The second electrode 17 may include one of a transparent electrically conductive film and a semitransparent electrically conductive film.

Figure 4:
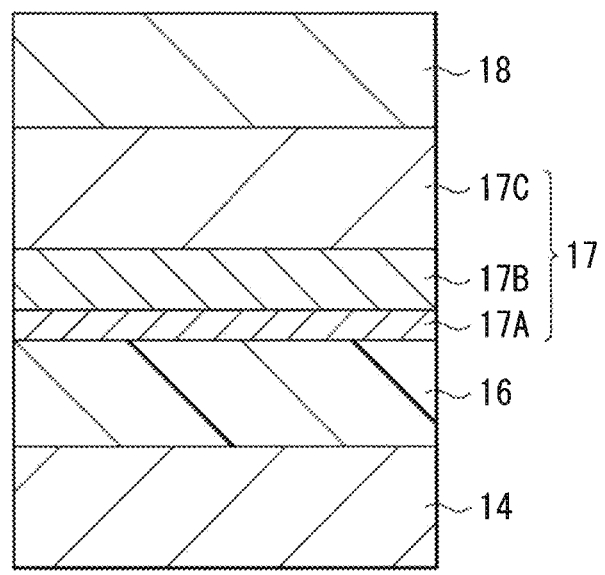
FIG. 4 is a cross-sectional view of a configuration of a key part of an organic EL device illustrated in FIG. 3.

FIG. 4 illustrates a device structure of the organic EL device 10A in an enlarged manner. In the present embodiment, the second electrode 17 may have a multilayer structure including the above-described transparent electrically conductive film. More specifically, the second electrode 17 has a configuration in which a first electrically conductive film 17A, a high-resistivity layer 17B, and a second electrically conductive film 17C are stacked in order from the organic layer 16. The first electrically conductive film 17A and the second electrically conductive film 17C may be each configured by the above-described transparent electrically conductive film. In this example, the first electrically conductive film 17A and the second electrically conductive film 17C may be each made of the same material. Examples of the material may include indium-zinc oxide (IZO).

The first electrically conductive film 17A may be formed before a repairing process described later, and may be configured by the transparent electrically conductive film. The first electrically conductive film 17A may have a transmittance of 80% or higher (average value) at a wavelength in a range from 400 nm to 700 nm, and may have an electric resistance in a range from $10^3$ Ω·cm to $10^4$ Ω·cm, for example. Further, the first electrically conductive film 17A may preferably have a thickness enough to allow for insulation by means of reverse bias application in the repairing process described later, for example, a thickness in a range from 1 nm to 100 nm. Examples of the transparent electrically conductive film may include indium-zinc oxide (IZO). Other examples of the transparent electrically conductive film, however, may also include indium-tin oxide (ITO), zinc oxide (ZnO), aluminum-doped zinc oxide (AZO), gallium-doped zinc oxide (GZO), and indium-titanium oxide (ITiO). The first electrically conductive film 17A may be formed by a sputtering method, for example.

The high-resistivity layer 17B is formed after the repairing process described later, and may be made of a material such as niobium oxide ($NbO_x$) and zinc oxide. The high-resistivity layer 17B may have a transmittance of 80% or higher (average value) at a wavelength in a range from 400 nm to 700 nm, and may have an electric resistance in a range from $10^4$ Ω·cm to $10^6$ Ω·cm, for example. The high-resistivity layer 17B may have a thickness in a range from 1 nm to 2,000 nm, for example. The thickness of the high-resistivity layer 17B may preferably be set so as not to cause a short circuit between the second electrically conductive film 17C and the first electrically conductive film 17A by filling a gap near a foreign matter in the first electrically conductive film 17A after reverse bias application.

The second electrically conductive film 17C may be made of the same material (e.g., IZO) as that of the first electrically conductive film 17A. The thickness of the second electrically conductive film 17C is not particularly limited, but may be preferably larger than that of the first electrically conductive film 17A, e.g., in a range from 100 nm to 2,000 nm, in order for the second electrically conductive film 17C to have lower resistance. This is because such a thickness enables a desired resistance value to be obtained.

Figure 5:
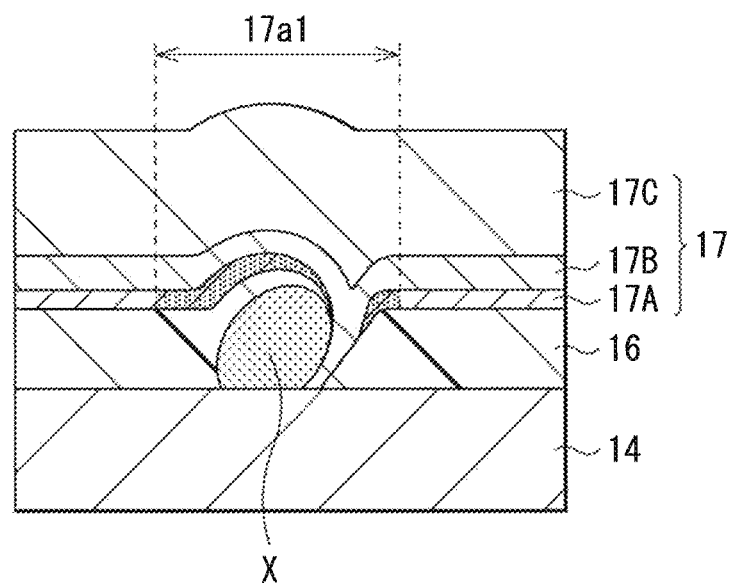
FIG. 5 is a schematic cross-sectional view of a configuration of the organic EL device illustrated in FIG. 4 near a foreign matter.

FIG. 5 schematically illustrates a device structure (near a foreign matter X) of the organic EL device 10A. As illustrated, when the foreign matter X is mixed in the organic layer 16, for example, the first electrically conductive film 17A has an insulated portion or an ablated portion due to blowing-off (local part 17a1) near the foreign matter X. In other words, a portion of the first electrically conductive film 17A is locally insulated or ablated. The local part 17a1 may be formed by the reverse bias application in the repairing process described later, and may serve to electrically cut a short path caused by the foreign matter X present between the first electrode 14 and the first electrically conductive film 17A. The local part 17a1 may be present at a plurality of locations corresponding to respective locations of the foreign matters X in an in-plane direction of the second electrode 17, for example.

The protective film 18 may be made of, for example, a protective material such as silicon nitride, silicon oxide, and metal oxide. It is to be noted that an adhesive layer 21 made of, for example, a curable resin such as a thermosetting resin and an ultraviolet-curable resin may be provided between the protective film 18 and the sealing substrate 20.

The sealing substrate 20 may be made of a transparent material such as glass. The color filter layer 19 may be provided on any of surfaces on light-incident side (device side) and light-emission side of the sealing substrate 20; for example, the color filter layer 19 may be provided on the surface on the light-incident side. Each of the color filers 19R, 19G 19B, and 19W may be provided to face the organic EL device 10A. The color filers 19R, 19G, and 19B may selectively transmit red light, green light, and blue light, respectively. The color filter 19W may be a filter that adjusts chromaticity and luminance for obtaining desired whiteness, for example. It is to be noted that the color filter 19W may not be necessarily provided.

[Manufacturing Method]

Figure 6:
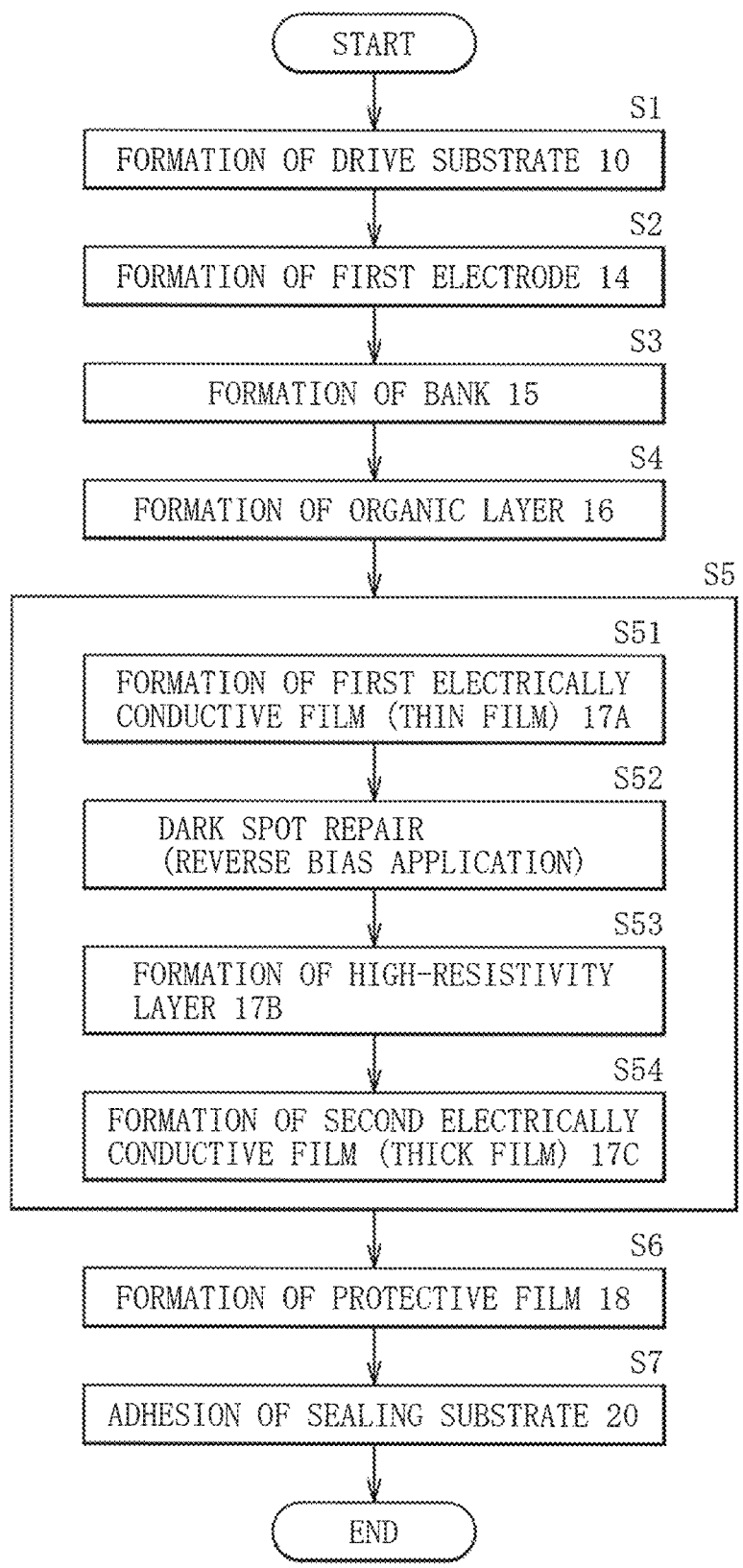
FIG. 6 is a flowchart for describing a method of manufacturing the display unit illustrated in FIG. 3.

FIG. 6 illustrates a flow of processes for manufacturing the display unit 1 as described above. As illustrated, the drive substrate 10 may be first formed (step S1). More specifically, the pixel drive circuit 140 including components such as the above-described transistors Tr1, Tr2, and the holding capacitor Cs may be formed on the substrate 11 by a low-temperature polysilicon process, for example. Thereafter, the planarization layer 13 may be formed on the entire surface of the substrate 11, following which a contact hole, for example, may be formed by patterning.

Thereafter, the first electrode 14 may be formed on the planarization layer 13 of the drive substrate 10 (step S2). More specifically, the first electrode 14 made of any of the above-mentioned materials may be formed, for example, on the planarization layer 13 by, for example, the sputtering method, followed by patterning by means of etching using a photolithography method, for example.

Subsequently, the bank 15 may be formed (step S3). More specifically, the above-mentioned insulating material may be formed and thereafter patterned to form an opening in a region facing the first electrode 14.

Thereafter, the organic layer 16 may be formed (step S4). More specifically, the white light-emitting layer made of a material such as any of the above-mentioned materials may be formed by a vacuum deposition method, for example. At this time, layers such as a hole injection layer, a hole transport layer, and an electron transport layer may be continuously formed by a vacuum consistent process.

Figure 7A:
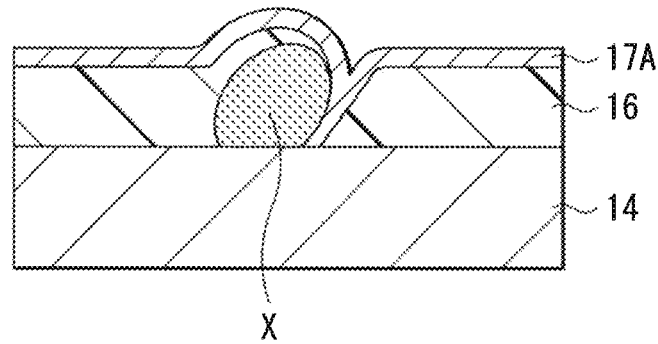
FIG. 7A is a schematic cross-sectional view for describing a process for forming a second electrode illustrated in FIGS. 4 and 5.
Figure 7B:
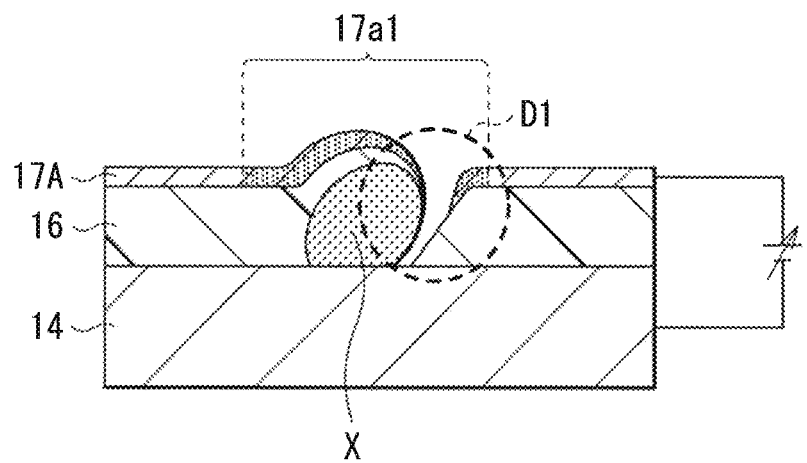
FIG. 7B is a schematic cross-sectional view for describing a process subsequent to FIG. 7A.
Figure 7C:
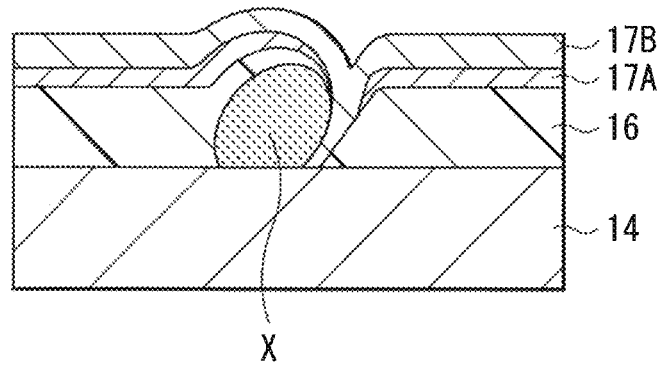
FIG. 7C is a schematic cross-sectional view for describing a process subsequent to FIG. 7B.

Next, the second electrode 17 may be formed (step S5). FIGS. 7A to 7C schematically illustrate a part of processes for forming the second electrode 17. More specifically, as illustrated in FIG. 7A, the first electrically conductive film 17A made of a material such as any of the above-mentioned materials may be first formed on the organic layer 16 by the sputtering method, for example (step S51).

Thereafter, as illustrated in FIG. 7B, a reverse bias is applied between the formed first electrically conductive film 17A and the first electrode 14, for example, at a direct-current voltage in a range from −1 V to −60 V for 1 second or more, preferably at a direct-current voltage of −40 V for 15 minutes. It is to be noted that the reverse bias is not limited to a direct-current voltage, but may also be an alternating-current voltage. Further, the reverse bias application may also be performed in an oxygen atmosphere. This causes the first electrically conductive film 17A to be insulated or blown off and ablated (i.e., local part 17a1 may be formed) to electrically cut a short path caused by the foreign matter X, thus making it possible to repair (i.e., remove) a dark spot portion (step S52). Thereafter, as illustrated in FIG. 7C, the high-resistivity layer 17B may be so formed by the sputtering method, for example, as to fill a gap near the foreign matter X in the organic layer 16 as illustrated in FIG. 7B. At this time, the thickness of the high-resistivity layer 17B may be preferably set so as not to cause a short circuit between the first electrically conductive film 17A that is transparent and the second electrically conductive film 17C that is formed subsequently.

Figure 8:
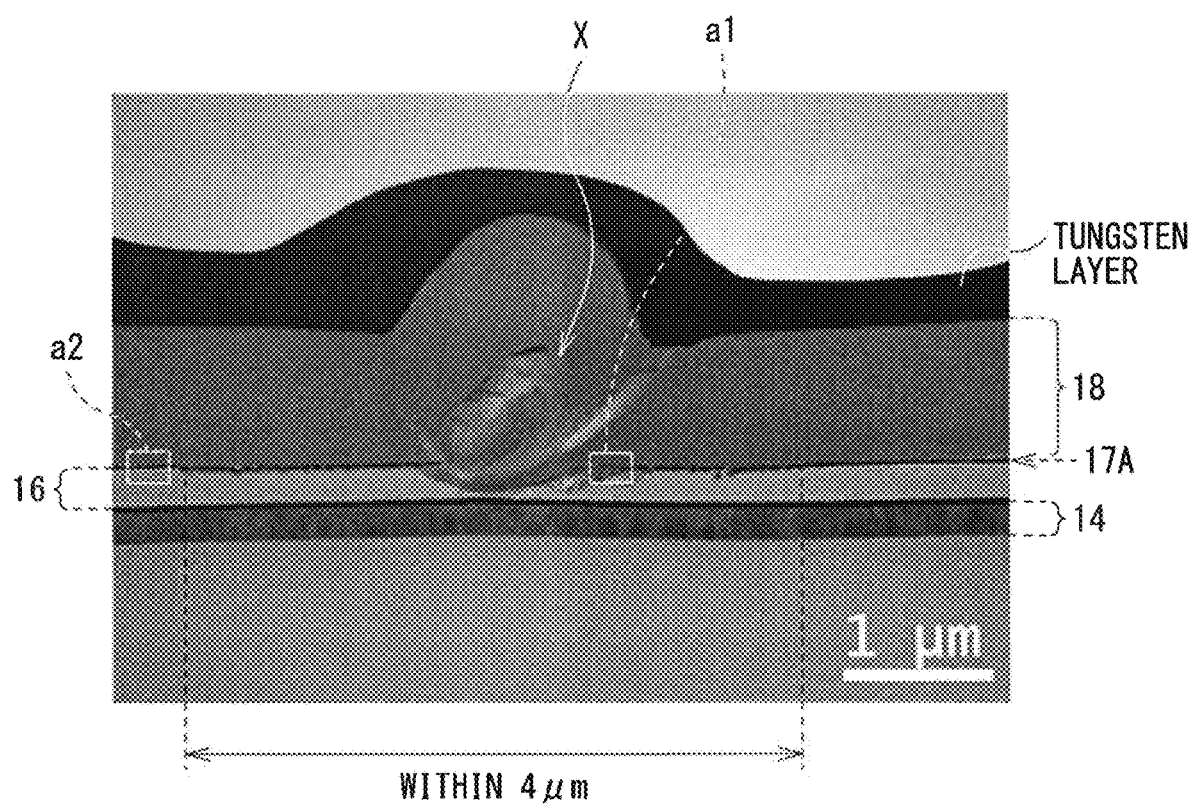
FIG. 8 is a photographed image of a cross-section of a portion near a foreign matter by means of a scanning transmission electron microscope (STEM).
Figure 9A:
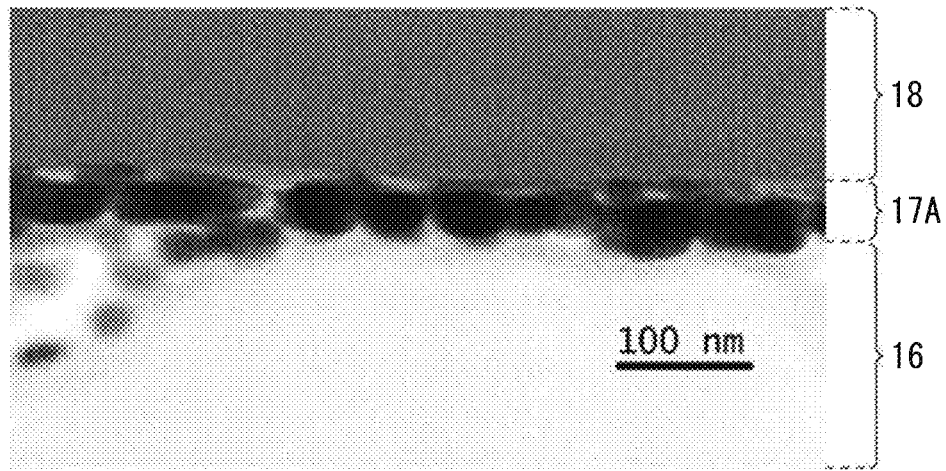
FIG. 9A is an enlarged view of a region in proximity to the foreign matter in the image illustrated in FIG. 8.
Figure 9B:
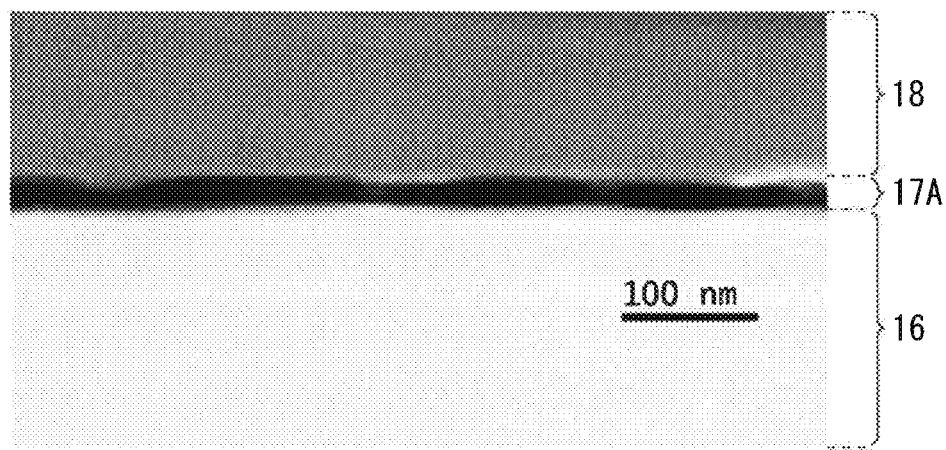
FIG. 9B is an enlarged view of a region distant from the foreign matter in the image illustrated in FIG. 8.

Here, FIG. 8 illustrates, as one example, a cross-sectional STEM image of a device after undergoing the reverse bias application. In this example, the organic layer 16, the first electrically conductive film 17A (cathode) that was transparent and was made of IZO, and the protective film 18 (SiN) were stacked on the first electrode 14 (anode). It is to be noted that a tungsten layer to be used for cross-sectional STEM analysis was formed on the protective film 18. The foreign matter X was confirmed inside the SiN film of the protective film 18. When a reverse bias (~40 V, 15 minutes) was applied between the first electrode 14 and the first electrically conductive film 17A of such a layered structure, granulation of IZO of the first electrically conductive film 17A was observed within a range of about 4 μm near the foreign matter X. FIGS. 9A and 9B illustrate, in an enlarged manner, a region a1 of FIG. 8 and a region a2 of FIG. 8, respectively. The region a1 had increased thickness of IZO compared to the region a2. Further, IZO was continuously layered in the region a2, whereas, in the region a1, the reverse bias application presumably caused IZO to undergo aggregation into a granulated state, thereby leading to the insulation presumably.

Subsequently, the second electrically conductive film 17C made of any of the above-mentioned materials and having the thickness as described above may be formed by the sputtering method, for example (step S53). In this manner, the second electrode 17 may be formed.

Next, the protective film 18 may be formed on the second electrode 17 by a chemical vapor deposition (CVD) method, for example. Finally, the sealing substrate 20 on which the color filter layer 19 is formed may be joined to the protective film 18 (step S6). Through these steps, the display unit 1 illustrated in FIG. 3 is completed.

[Workings and Effects]

As illustrated in FIGS. 1 and 2, in the display unit 1 according to the present embodiment, a scanning signal may be supplied from the scanning line drive circuit 130 to the gate of the transistor Tr2 of each of the pixels, and an image signal may be supplied from the signal line drive circuit 120 through the transistor Tr2 to the holding capacitor Cs and held therein. Depending on the signal held in the holding capacitor Cs, the transistor Tr1 may be ON/OFF controlled, thereby causing a drive current (drain current Ids) to be injected into the organic EL device 10A. The drive current may be injected into the light-emitting layer of the organic layer 16 through the first electrode 14 and the second electrode 17, thus allowing holes and electrons to be recombined to cause light emission in the organic layer 16. In this example, white light is generated from the organic layer 16 of each of the organic EL devices 10A.

When white light is generated from each of the organic EL devices 10A, the white light may be transmitted through the second electrode 17, the color filter layer 19 (any of 19R, 19G, 19B, and 19W), and the sealing substrate 20 to be outputted upward above the display unit 1. This allows image display to be performed, in which one pixel is configured by a set of the organic EL devices 10A that emit respective color beams of R, G, B, and W.

Here, in the present embodiment, the first electrically conductive film 17A that is transparent includes the insulated or ablated local part (local part 17a1 in FIG. 5) in the second electrode 17. The local part 17a1 may be formed by the reverse bias application in the manufacturing process, and the local part 17a1 may electrically cut the short path caused by the foreign matter. The stacking of the second electrically conductive film 17C on the first electrically conductive film 17A with the high-resistivity layer 17B being interposed therebetween makes it possible to allow the second electrode 17 to have lower resistance without increasing the thickness of the first electrically conductive film 17A, thus enabling voltage drop to be easily suppressed.

Figure 10:
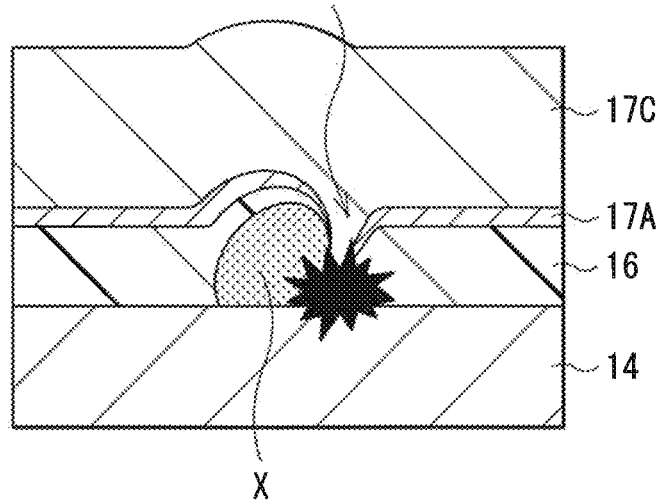
FIG. 10 is a schematic cross-sectional view of a configuration of a key part of a display unit according to a comparative example.

Moreover, the interposing of the high-resistivity layer 17B brings the following advantages. Here, suppose that the transparent second electrically conductive film 17C having a thick film is formed directly, i.e., adjacently on the transparent first electrically conductive film 17A having undergone the dark spot repair by the reverse bias application as illustrated in FIG. 10, another short circuit may occur in some cases. In contrast, as in the present embodiment, formation of the second electrically conductive film 17C on the first electrically conductive film 17A with the high-resistivity layer 17B being interposed therebetween makes it possible to suppress such occurrence of another short circuit, thus alleviating the influence of the dark spot on display image quality.

As described above, in the present embodiment, the second electrically conductive film 17C is provided on the first electrically conductive film 17A that is transparent and includes the insulated or ablated local part 17a1, with the high-resistivity layer 17B being interposed therebetween in the second electrode 17. Therefore, it becomes possible to reduce the short path caused by the foreign matter while allowing the second electrode 17 to have lower resistance. Further, the interposing of the high-resistivity layer 17B enables suppression of the occurrence of another short circuit. It is possible to alleviate the influence of the dark spot on display image quality while suppressing the voltage drop in the second electrode 17. Thus, it becomes possible to suppress deterioration of the display image quality.

Next, description is given of other embodiments and a modification example of the disclosure. Hereinafter, the same reference numerals are assigned to the same components as those in the first embodiment, and description thereof is omitted as appropriate.

Second Embodiment

Figure 11:
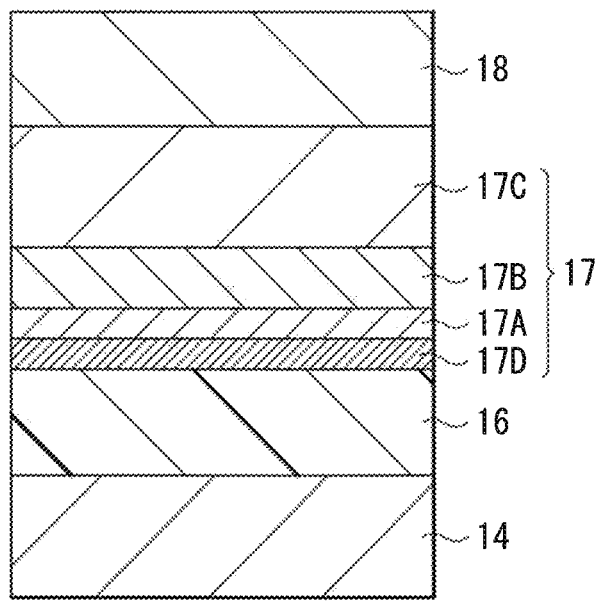
FIG. 11 is a cross-sectional view of a configuration of a key part of a display unit according to a second embodiment of the disclosure.

FIG. 11 illustrates a configuration of a key part of a display unit according to a second embodiment of the disclosure. The present embodiment differs from the foregoing first embodiment in that a third electrically conductive film 17D is further provided between the first electrically conductive film 17A and the organic layer 16 in the second electrode 17. More specifically, the second electrode 17 of the present embodiment may include, in order from the organic layer 16, the third electrically conductive film 17D, the first electrically conductive film 17A, the high-resistivity layer 17B, and the second electrically conductive film 17C.

The third electrically conductive film 17D may serve as a cathode and may be provided for optical adjustment. The third electrically conductive film 17D may also have a role of absorbing laser light in repairing a dark spot by laser irradiation as described later. The third electrically conductive film 17D may be configured by a semitransparent electrically conductive film made of, for example, an alloy of magnesium (Mg) and silver (Ag), i.e., a magnesium-silver alloy (MgAg). The third electrically conductive film 17D may have a thickness, for example, in a range from 1 nm to 20 nm, and preferably from 5 nm to 10 nm, in consideration of viewing angle characteristics.

Figure 12:
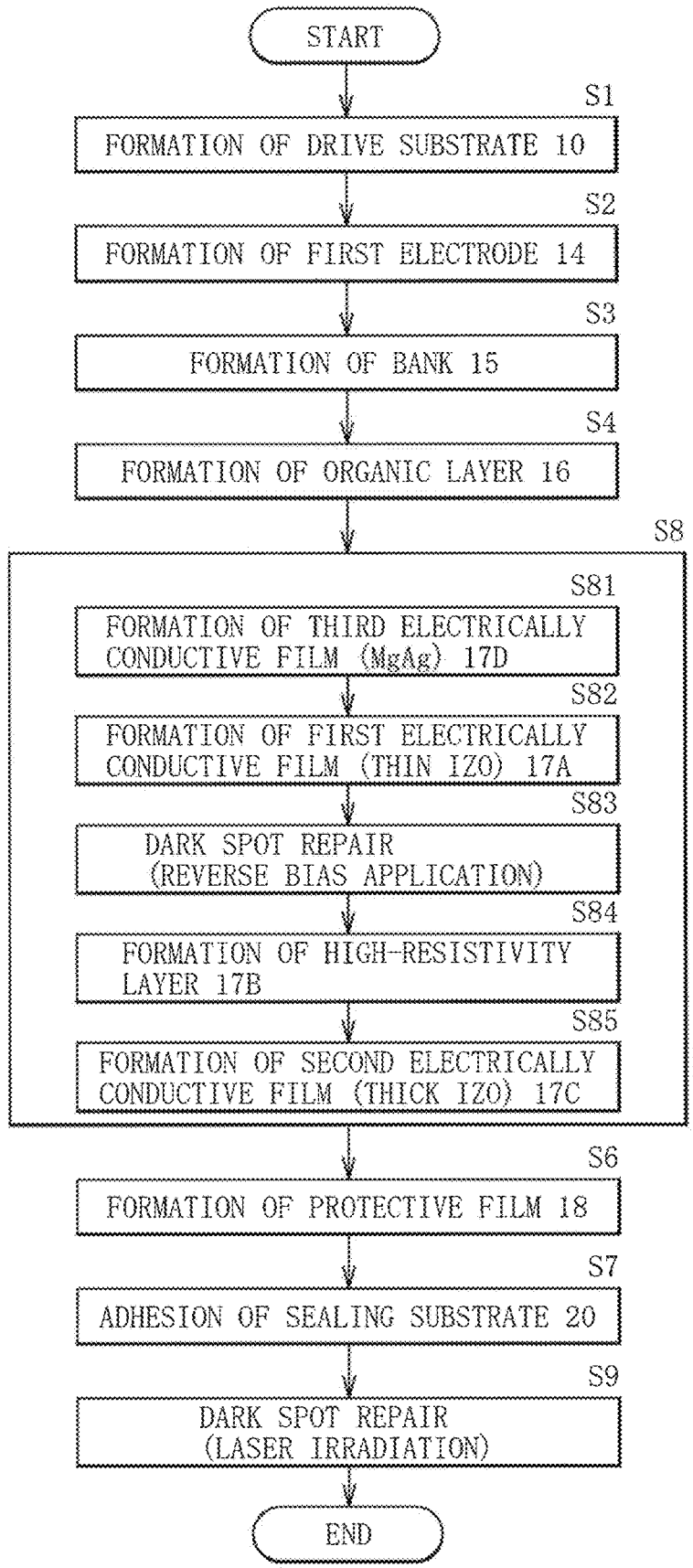
FIG. 12 is a flowchart for describing a method of manufacturing the display unit illustrated in FIG. 11.

FIG. 12 illustrates a flow of a method of manufacturing the display unit of the present embodiment. The method of manufacturing the display unit of the present embodiment differs from that of the foregoing first embodiment in the layered structure-forming procedure in the process of forming the second electrode 17 (step S8) and also in that another dark spot repair is performed after the adhesion of the sealing substrate 20. The manufacturing method of the present embodiment is similar to that of the foregoing first embodiment in the process from the formation of the drive substrate 10 to the formation of the organic layer 16 (steps S1 to S4) and in the formation of the protective film 18 (step S6) and the adhesion of the sealing substrate 20 (step S7).

In the present embodiment, the second electrode 17 may be formed as follows (step S8). More specifically, the third electrically conductive film 17D made of a material such as any of the above-mentioned materials may be formed by a vapor deposition method or a sputtering method, for example (step S81). Thereafter, the first electrically conductive film 17A made of a material such as any of the above-mentioned materials may be formed in the same manner as the foregoing first embodiment (step S82). Subsequently, a reverse bias is applied between the first electrically conductive film 17A and the first electrode 14 in the same manner as the foregoing first embodiment. This causes the first electrically conductive film 17A to be insulated or blown off and ablated to electrically cut a short path caused by the foreign matter X, thus making it possible to repair (i.e., remove) a dark spot portion (step S83). Thereafter, the high-resistivity layer 17B may be formed in the same manner as the foregoing first embodiment (step S84). The second electrically conductive film 17C may be formed on the high-resistivity layer 17B in the same manner as the foregoing first embodiment (step S85). In this manner, the second electrode 17 may be formed.

Further, after the adhesion of the sealing substrate 20, another dark spot repair may be performed by laser light irradiation (step S9). More specifically, for example, an yttrium-aluminum-garnet (YAG) laser having a wavelength of 1,064 nm may be used to blow off a short circuit portion near the foreign matter. The short circuit portion may be only the third electrically conductive film 17D or both the third electrically conductive film 17D and the first electrically conductive film 17A. This allows the short path caused by the foreign matter to be electrically cut. It is to be noted that, although the dark spot repair by laser irradiation is performed after the sealing in this example, the second dark spot repair may also be performed between the formation of the protective film 18 and the adhesion of the sealing substrate 20.

In the present embodiment, the dark spot repair is performed by the reverse bias application in the first electrically conductive film 17A, and thereafter the second electrically conductive film 17C is formed with the high-resistivity layer 17B being interposed therebetween in the second electrode 17, thus making it possible to achieve effects similar to those of the foregoing first embodiment. In addition, providing the third electrically conductive film 17D between the organic layer 16 and the first electrically conductive film 17A enables the optical adjustment as well as two-time dark spot repairs. This makes it possible to repair, with the second dark spot repair, a portion that is insufficient in insulation of a portion near the foreign matter in the first repair (dark spot repair by reverse bias application) even when there is such a portion, thus allowing the dark spot portion to be repaired more securely.

Third Embodiment

Figure 13:
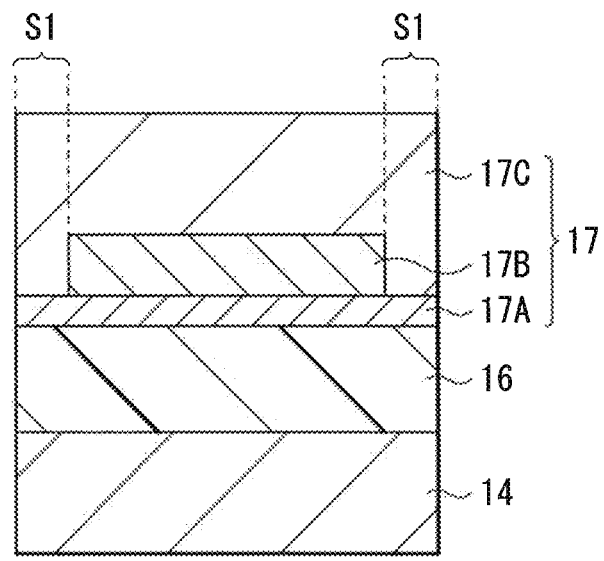
FIG. 13 is a cross-sectional view of a configuration of a key part of a display unit according to a third embodiment of the disclosure.
Figure 14A:
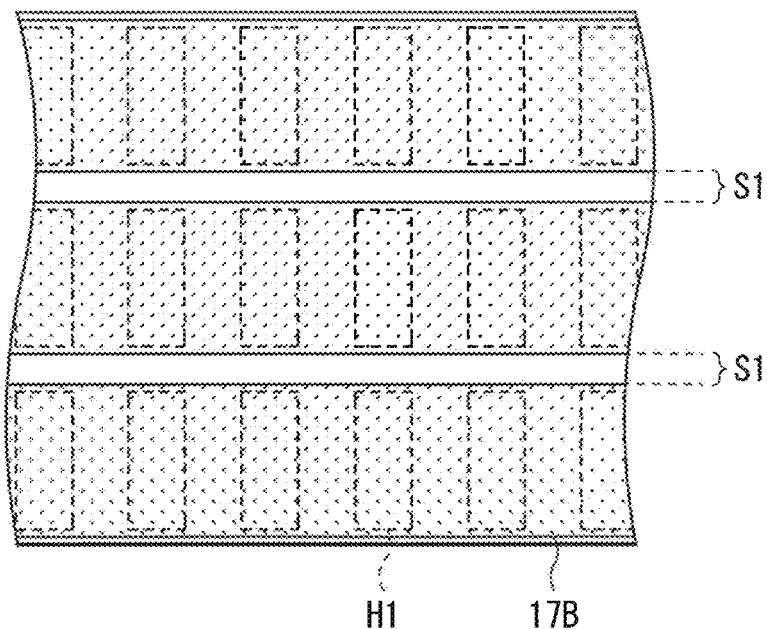
FIG. 14A is a schematic plan view for describing a configuration of a high-resistivity layer illustrated in FIG. 13.
Figure 14B:
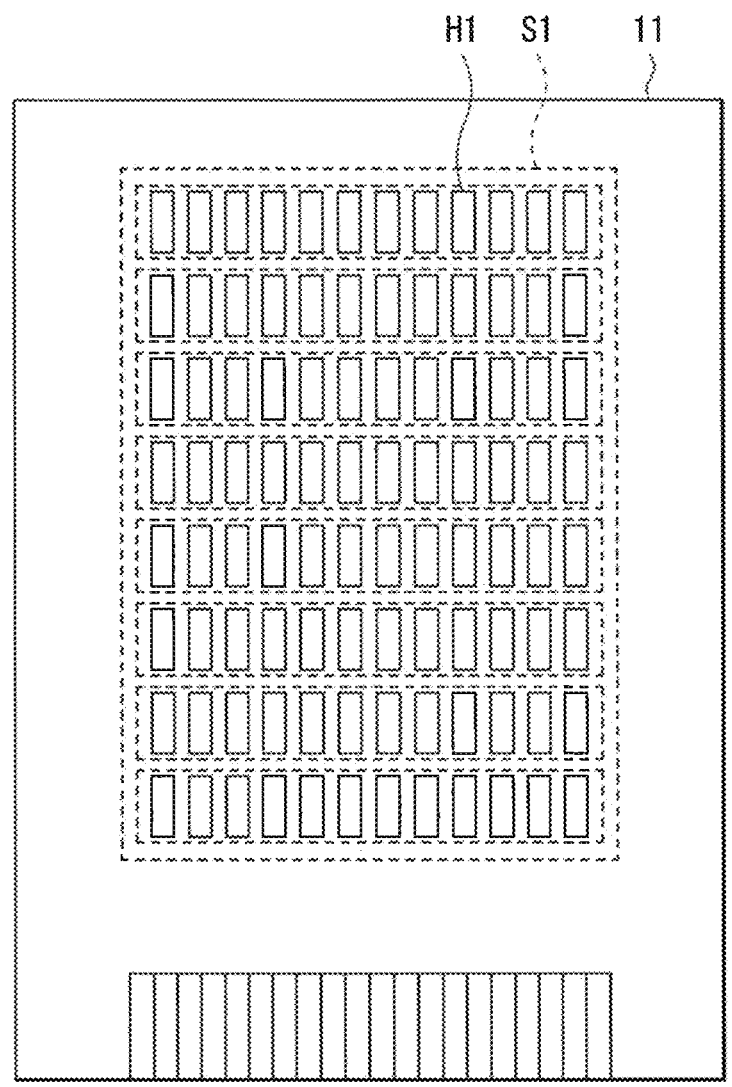
FIG. 14B is a schematic plan view for describing a configuration of the high-resistivity layer illustrated in FIG. 13.

FIG. 13 illustrates a configuration of a key part of a display unit according to a third embodiment of the disclosure. The present embodiment differs from the foregoing first embodiment in that the high-resistivity layer 17B is patterned in the second electrode 17 and in that the second electrode 17 has a portion (portion S1) where the high-resistivity layer 17B is selectively removed. The portion S1 may correspond to a "first portion" in an embodiment of the disclosure. More specifically, the high-resistivity layer 17B of the present embodiment may be selectively removed at least in a portion (between pixels) except a pixel opening H1 (opening portion of the bank 15), for example. In other words, the second electrode 17 may have the portion S1 where the high-resistivity layer 17B is not formed. As one example, the high-resistivity layer 17B may be selectively removed in the portion S1 having a stripe shape in the row direction or the column direction of the pixel opening H1 as illustrated in FIGS. 14A and 14B. Such a high-resistivity layer 17B may be formed, for example, by using a predetermined mask during the film formation.

In the present embodiment, the layered structure of the first electrically conductive film 17A, the high-resistivity layer 17B, and the second electrically conductive film 17C makes it possible to achieve effects similar to those of the foregoing first embodiment. Further, the portion S1 where the high-resistivity layer 17B is selectively removed enables the first electrically conductive film 17A and the second electrically conductive film 17C to be electrically coupled in the portion S1. This makes it possible to suppress voltage drop in the second electrode 17 more effectively.

Fourth Embodiment

Figure 15:
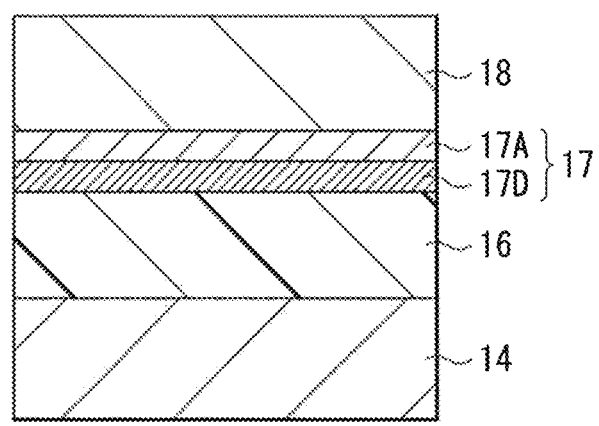
FIG. 15 is a cross-sectional view of a configuration of a key part of a display unit according to a fourth embodiment of the disclosure.

FIG. 15 illustrates a configuration of a key part of a display unit according to a fourth embodiment of the disclosure. The present embodiment differs from the foregoing first embodiment in that the second electrode 17 is configured by layered films of the third electrically conductive film 17D and the first electrically conductive film 17A. More specifically, the second electrode 17 of the present embodiment may have a configuration in which the third electrically conductive film 17D and the first electrically conductive film 17A are stacked in this order from the organic layer 16, with the protective film 18 being formed on the first electrically conductive film 17A.

Figure 16:
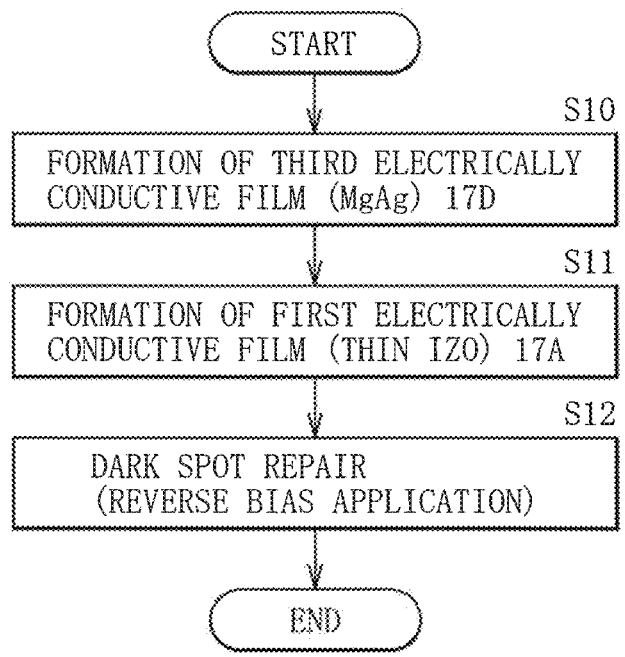
FIG. 16 is a flowchart for describing an example of a method of manufacturing the display unit (method of forming a second electrode) illustrated in FIG. 15.

FIG. 16 illustrates a flow of a method of manufacturing the display unit (method of forming the second electrode 17) of the present embodiment. It is to be noted that the process before the formation of the second electrode 17 (steps S1 to S4) and process after the formation of the second electrode 17 (steps S6 and S7) are both similar to those in the foregoing first embodiment. Further, after the adhesion of the sealing substrate 20, the dark spot repair process by laser irradiation (step S9) may be performed in the same manner as the foregoing second embodiment. In the present embodiment, however, the second electrode 17 may be formed as follows.

That is, the third electrically conductive film 17D made of a material such as any of the above-mentioned materials may be first formed in the same manner as the foregoing second embodiment (step S10). Subsequently, the first electrically conductive film 17A may be formed in the same manner as the foregoing first embodiment (step S11). Thereafter, a reverse bias is applied between the first electrically conductive film 17A and the first electrode 14 using conditions similar to those of the foregoing first embodiment (step S12). This allows a short path caused by the foreign matter to be electrically cut, thus repairing a dark spot portion. In this manner, the second electrode 17 may be formed.

Figure 17:
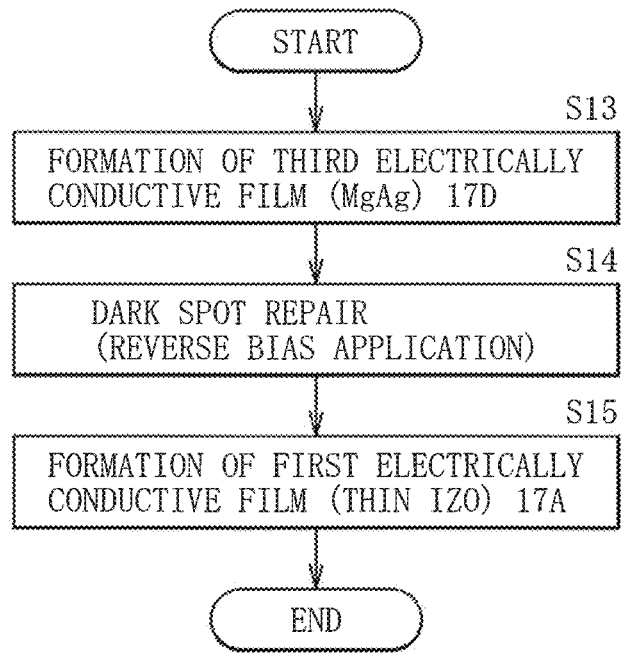
FIG. 17 is a flowchart for describing another example of the method of manufacturing the display unit (method of forming the second electrode) illustrated in FIG. 15.
Figure 18:
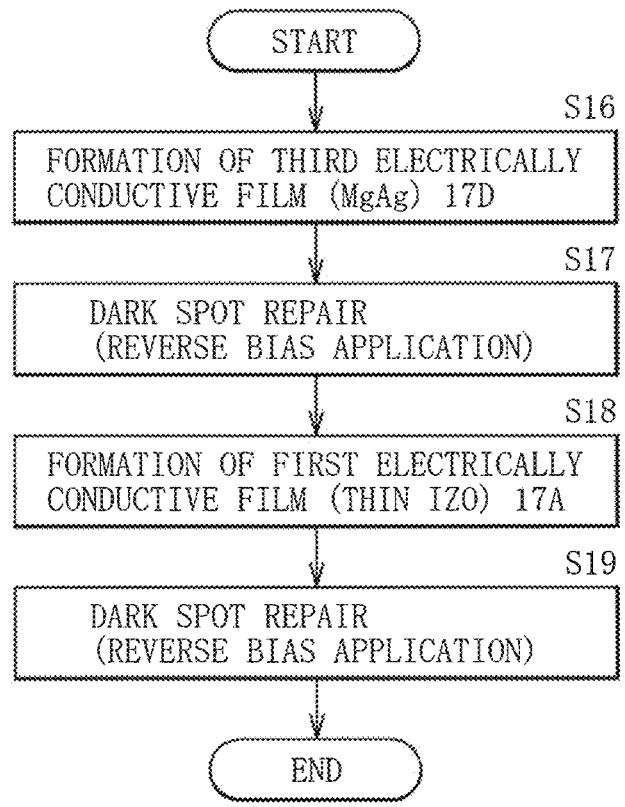
FIG. 18 is a flowchart for describing another example of the method of manufacturing the display unit (method of forming the second electrode) illustrated in FIG. 15.

FIGS. 17 and 18 each illustrate another example of the method of forming the second electrode 17 of the present embodiment. In the above-described example of FIG. 16, the reverse bias is applied between the first electrode 14 and the first electrically conductive film 17A after the formation of the third electrically conductive film 17D and the first electrically conductive film 17A; however, a timing for the reverse bias application is not limited thereto. For example, as illustrated in FIG. 17, the third electrically conductive film 17D may be formed (step S13), and thereafter a reverse bias is applied between the first electrode 14 and the third electrically conductive film 17D (step S14). Conditions such as application voltage and application time are similar to the conditions for the reverse bias application in the foregoing first embodiment. This allows the short path caused by the foreign matter to be electrically cut, thus making it possible to remove the dark spot portion. Thereafter, the first electrically conductive film 17A may be formed on the third electrically conductive film 17D by the sputtering method, for example (step S15). In this manner, the second electrode 17 may be formed.

Further, as illustrated in FIG. 18, further reverse bias application may also be performed after the formation of the second electrode 17. In this case, the third electrically conductive film 17D may be formed (step S16), and thereafter a reverse bias is applied between the first electrode 14 and the third electrically conductive film 17D (step S17). Subsequently, the first electrically conductive film 17A may be formed (step S18), and a reverse bias is applied again between the formed first electrically conductive film 17A and the first electrode 14 (step S19). Conditions such as application voltage and application time are similar to the conditions for the reverse bias application in the foregoing first embodiment. This allows the short path caused by the foreign matter to be electrically cut, thus making it possible to remove the dark spot portion. It is to be noted that, this example involves a total of three repairing processes including the subsequent repairing process by laser irradiation after the sealing. As described, a timing for the dark spot repair is not particularly limited; alternatively, the dark spot repair may be performed once or a plurality of times.

As described above, in the present embodiment, the formation of the first electrically conductive film 17A on the third electrically conductive film 17D enables the second electrode 17 to have lower resistance more easily than a case of using the first electrically conductive film 17A as a monolayer, thus making it advantageous in suppressing the voltage drop. Further, by performing the dark spot repair with laser irradiation after the sealing, it becomes possible to remove, with the second dark spot repair, a portion that is insufficient in insulation in the first dark spot repair (dark spot repair by reverse bias application) even when there is such a portion.

Fifth Embodiment

Figure 19:
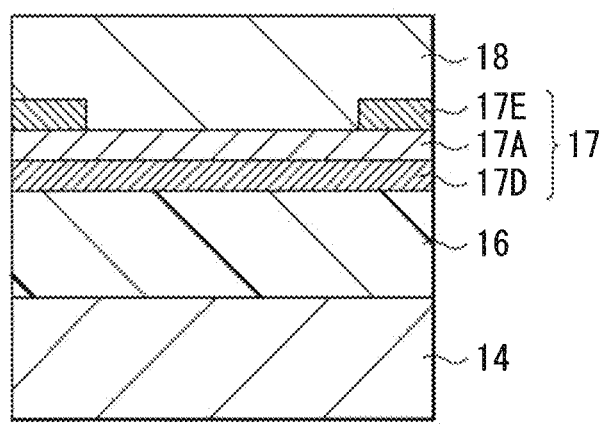
FIG. 19 is a cross-sectional view of a configuration of a key part of a display unit according to a fifth embodiment of the disclosure.

FIG. 19 illustrates a configuration of a key part of a display unit according to a fifth embodiment of the disclosure. The present embodiment differs from the foregoing first embodiment in that the second electrode 17 is configured by layered films of the third electrically conductive film 17D, the first electrically conductive film 17A, and a wiring line layer 17E. More specifically, the second electrode 17 of the present embodiment may have a configuration in which the third electrically conductive film 17D, the first electrically conductive film 17A, and the wiring line layer 17E are stacked in this order from the organic layer 16, with the protective film 18 being formed on the wiring line layer 17E.

Figure 20A:
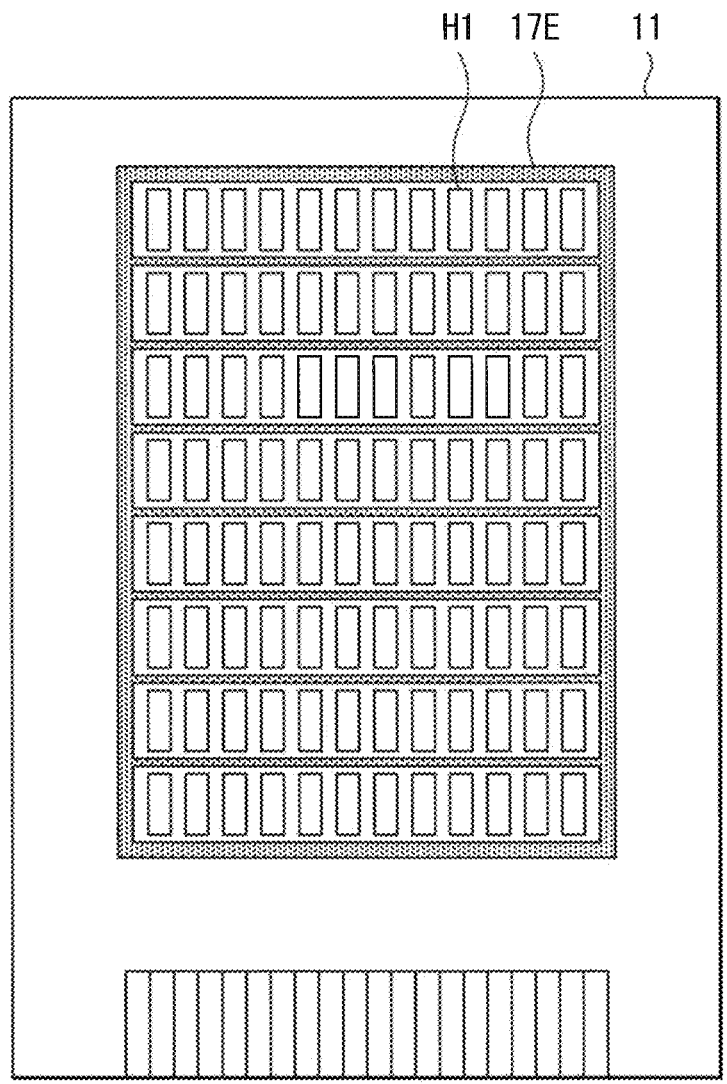
FIG. 20A is a schematic plan view for describing a configuration of a wiring line layer illustrated in FIG. 19.
Figure 20B:
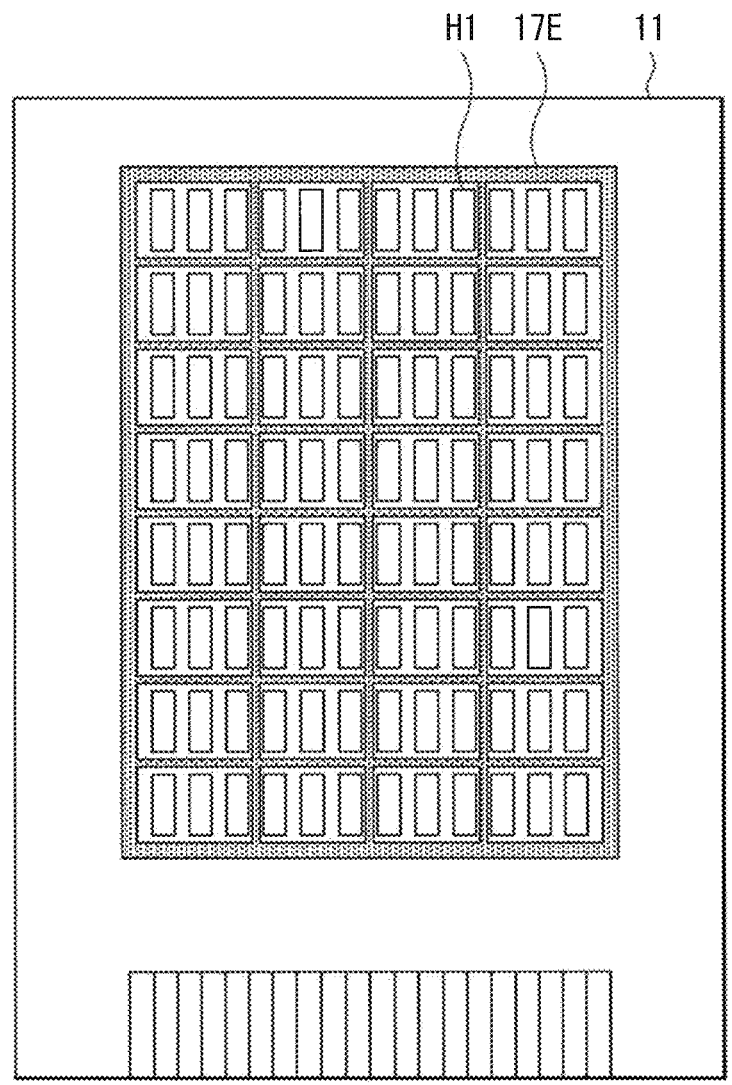
FIG. 20B is a schematic plan view for describing a configuration of the wiring line layer illustrated in FIG. 19.

In the second electrode 17 of the present embodiment, the wiring line layer 17E may be pattern-formed on the first electrically conductive film 17A. More specifically, the wiring line layer 17E may be formed to extend in a selective region (between pixels) except the pixel opening H1 (opening portion of the bank 15), for example. As one example, the wiring line layer 17E may be formed in a stripe manner in the row direction or the column direction of the pixel opening H1 as illustrated in FIG. 20A. Alternatively, the wiring line layer 17E may be formed in a lattice manner (in a matrix manner) as illustrated in FIG. 20B.

Figure 21:
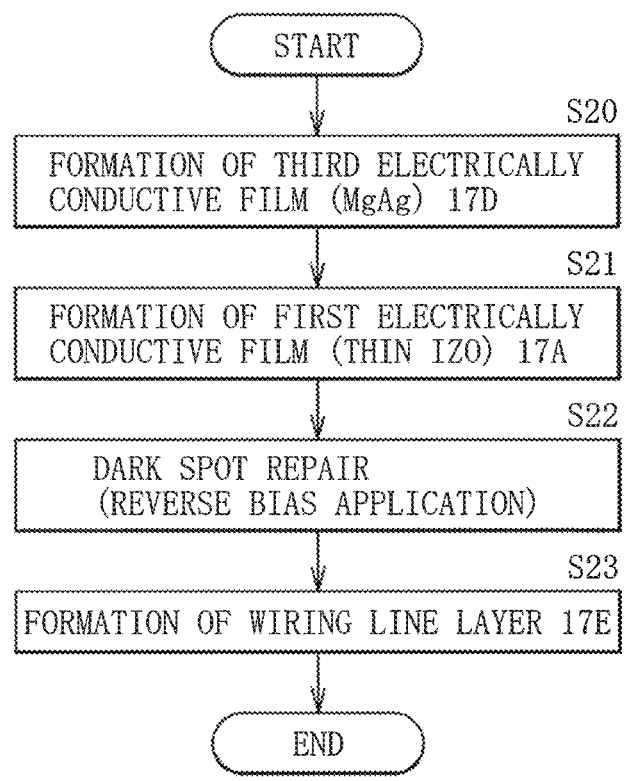
FIG. 21 is a flowchart for describing a method of manufacturing the display unit (method of forming a second electrode) illustrated in FIG. 19.

FIG. 21 illustrates a flow of a method of manufacturing the display unit (method of forming the second electrode 17) of the present embodiment. It is to be noted that the process before the formation of the second electrode 17 (steps S1 to S4) and process after the formation of the second electrode 17 (steps S6 and S7) are both similar to those in the foregoing first embodiment. Further, after the adhesion of the sealing substrate 20, the dark spot repair process by laser irradiation (step S9) may be performed in the same manner as the foregoing second embodiment. In the present embodiment, however, the second electrode 17 may be formed as follows.

That is, the third electrically conductive film 17D made of a material such as any of the above-mentioned materials may be first formed in the same manner as the foregoing second embodiment (step S20). Subsequently, the first electrically conductive film 17A may be formed in the same manner as the foregoing first embodiment (step S21). Thereafter, a reverse bias is applied between the first electrically conductive film 17A and the first electrode 14 using conditions similar to those of the foregoing first embodiment (step S22). This allows a short path caused by the foreign matter to be electrically cut, thus repairing a dark spot portion.

Consequently, the wiring line layer 17E may be formed to have a stripe shape or a matrix shape, for example, in a plan view, on the first electrically conductive film 17A. Such a wiring line layer 17E may be formed of a material such as molybdenum (Mo) and IZO using, for example, a high-precision mask by means of the sputtering method, for example. Alternatively, the wiring line layer 17E may also be formed of a material such as aluminum (Al) and silver using the high-precision mask by means of the vapor deposition method, for example. Further alternatively, it is also possible for the wiring line layer 17E to be formed of a low-nano ink electrically conductive material containing any of silver, aluminum, tin (Sn), zinc (Zn), copper (Cu), and gold (Au), for example, by means of a printing method such as reverse printing, offset printing, spray coating, ink-jet printing, stripe coating, and screen printing.

In the present embodiment, the formation of the wiring line layer 17E on the first electrically conductive film 17A makes it possible to allow the second electrode 17 to have lower resistance without increasing the thickness of the first electrically conductive film 17A, thus enabling voltage drop to be easily suppressed. Therefore, it becomes possible to reduce the short path caused by the foreign matter, while suppressing the voltage drop in the second electrode 17, thus making it possible to achieve substantially the same effects as those of the foregoing first and second embodiments.

Sixth Embodiment

Figure 22:
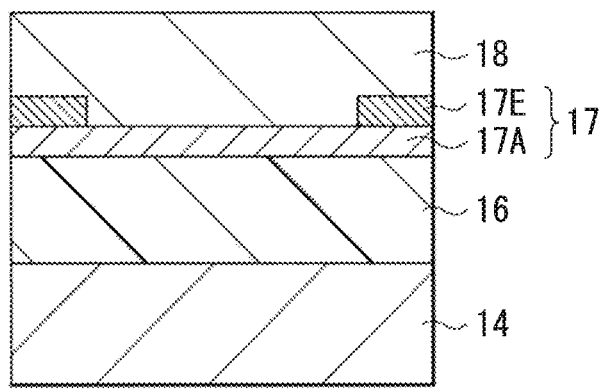
FIG. 22 is a cross-sectional view of a configuration of a key part of a display unit according to a sixth embodiment of the disclosure.

FIG. 22 illustrates a configuration of a key part of a display unit according to a sixth embodiment of the disclosure. The present embodiment differs from the foregoing first embodiment in that the second electrode 17 is configured by layered films of the first electrically conductive film 17A and the wiring line layer 17E. More specifically, the second electrode 17 of the present embodiment may have a configuration in which the first electrically conductive film 17A and the wiring line layer 17E are stacked in this order from the organic layer 16, with the protective film 18 being formed on the wiring line layer 17E. The constituent material and the planar layout of the wiring line layer 17E are similar to those described in the foregoing fifth embodiment.

Figure 23:
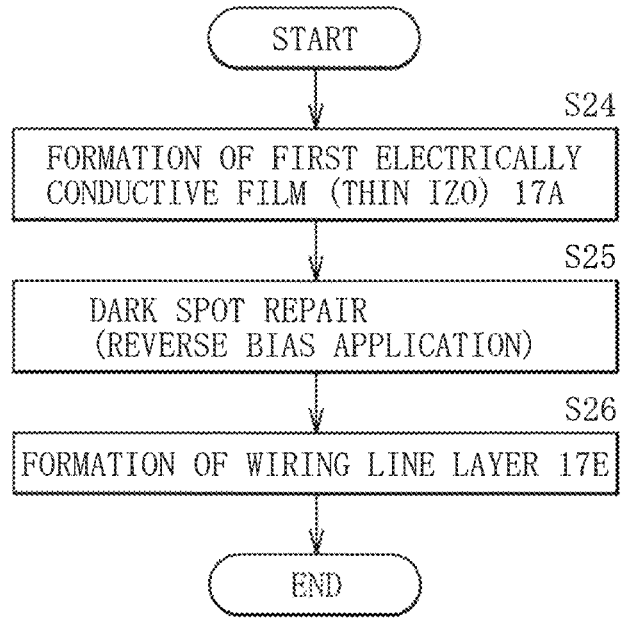
FIG. 23 is a flowchart for describing a method of manufacturing the display unit (method of forming a second electrode) illustrated in FIG. 22.

FIG. 23 illustrates a flow of a method of manufacturing the display unit (method of forming the second electrode 17) of the present embodiment. It is to be noted that the process before the formation of the second electrode 17 (steps S1 to S4) and process after the formation of the second electrode 17 (steps S6 and S7) are both similar to those in the foregoing first embodiment. Further, after the adhesion of the sealing substrate 20, the dark spot repair process by laser irradiation (step S9) may be performed in the same manner as the foregoing second embodiment. In the present embodiment, however, the second electrode 17 may be formed as follows.

That is, the first electrically conductive film 17A made of a material such as any of the above-mentioned materials may be first formed in the same manner as the foregoing first embodiment (step S24). Thereafter, a reverse bias is applied between the first electrically conductive film 17A and the first electrode 14 using conditions similar to those of the foregoing first embodiment (step S25). This allows a short path caused by the foreign matter to be electrically cut, thus repairing a dark spot portion. Subsequently, the wiring line layer 17E is formed on the first electrically conductive film 17A in the same manner as the foregoing fifth embodiment.

Also in the present embodiment, the formation of the wiring line layer 17E on the first electrically conductive film 17A makes it possible to allow the second electrode 17 to have lower resistance without increasing the thickness of the first electrically conductive film 17A. Therefore, it becomes possible to achieve substantially the same effects as those of the foregoing first embodiment.

Modification Example

Figure 24A:
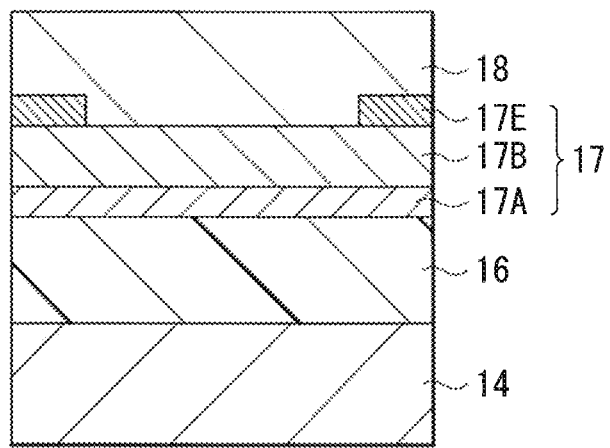
FIG. 24A is a cross-sectional view of a configuration of a key part of a display unit according to a modification example.
Figure 24B:
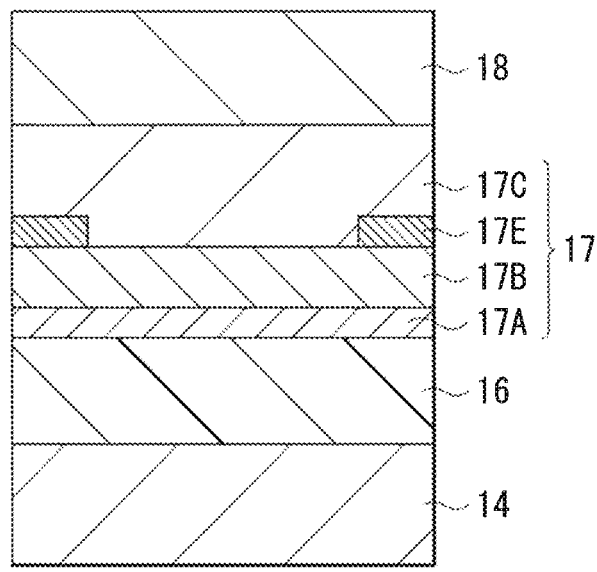
FIG. 24B is a cross-sectional view of a configuration of a key part of a display unit according to a modification example.
Figure 24C:
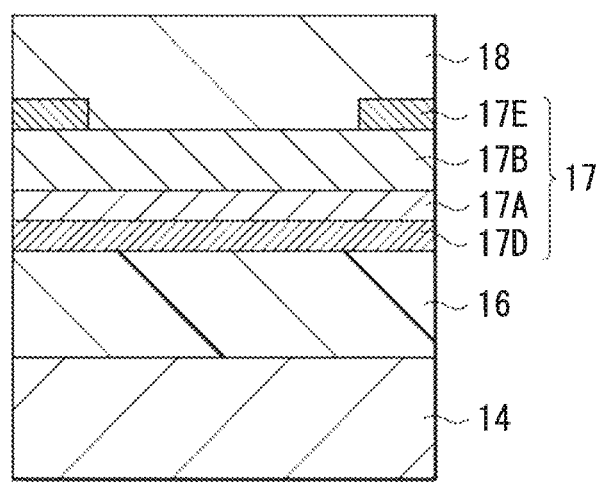
FIG. 24C is a cross-sectional view of a configuration of a key part of a display unit according to a modification example.

It is to be noted that the second electrode in the display unit according to an embodiment of the disclosure may have other various structures in addition to the layered structures of the second electrode 17 mentioned in the foregoing respective embodiments. For example, it is sufficient for the layered structure to include at least the first electrically conductive film 17A, among the first electrically conductive film 17A, the high-resistivity layer 17B, the second electrically conductive film 17C, the third electrically conductive film 17D, and the wiring line layer 17E. However, the structure using the high-resistivity layer 17B may be preferable, as in the foregoing first and second embodiments. As the structure using the high-resistivity layer 17B, structures as illustrated in FIGS. 24A to 24C may also be adopted in addition to those described above. More specifically, FIG. 24A illustrates an example in which the second electrode 17 includes the first electrically conductive film 17A, the high-resistivity layer 17B, and the wiring line layer 17E from the organic layer 16. FIG. 24B illustrates an example in which the second electrode 17 includes the first electrically conductive film 17A, the high-resistivity layer 17B, the wiring line layer 17E, and the second electrically conductive film 17C from the organic layer 16. FIG. 24C illustrates an example in which the second electrode 17 includes the third electrically conductive film 17D, the first electrically conductive film 17A, the high-resistivity layer 17B, and the wiring line layer 17E from the organic layer 16. In the example of FIG. 24C, the second electrically conductive film 17C may be further formed on the wiring line layer 17E.

Application Examples

The display unit described in the foregoing embodiments and modification example is applicable to electronic apparatuses in any fields that display, as an image, an image signal inputted from outside or an image signal generated inside. The followings illustrate some examples thereof.

Figure 25A:
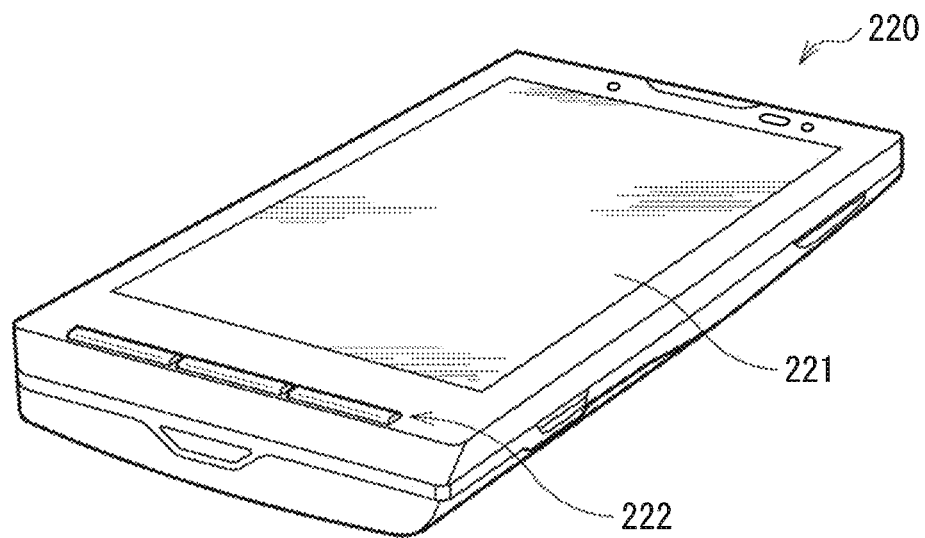
FIG. 25A is a perspective view of a configuration of a smartphone.
Figure 25B:
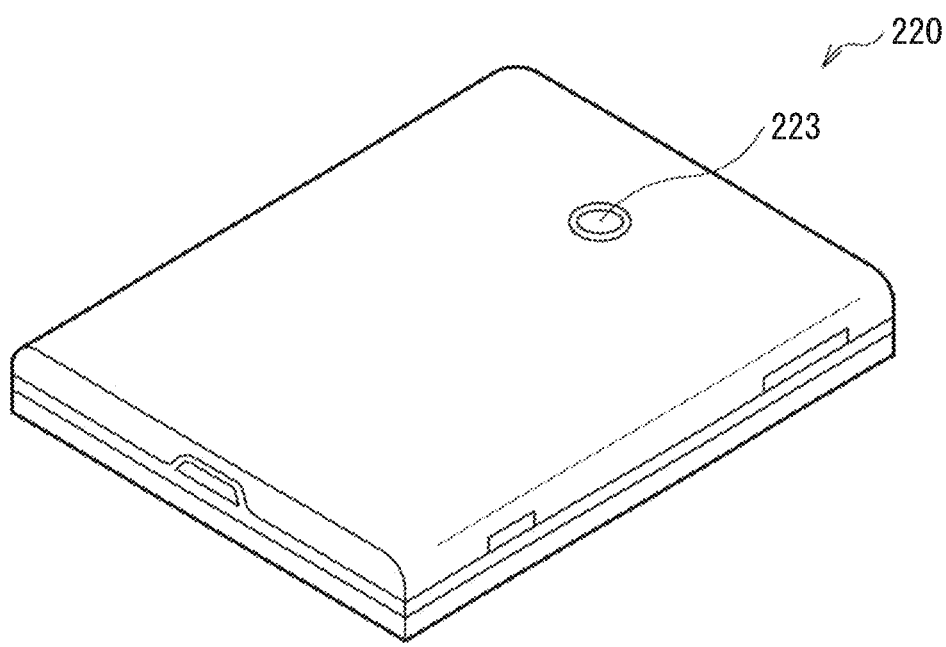
FIG. 25B is a perspective view of a configuration of the smartphone.

FIGS. 25A and 25B illustrate outer appearances of a smartphone 220. The smartphone 220 may include, for example, a display section 221 and an operation section 222 on front side, and a camera 223 on rear side; the display unit of any of the foregoing embodiments may be mounted on the display section 221.

Figure 26:
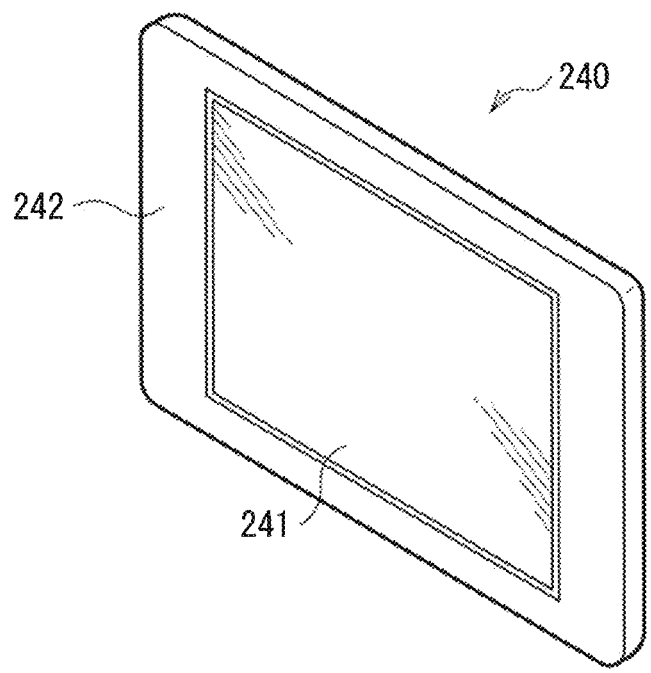
FIG. 26 is a perspective view of a configuration of a tablet personal computer.

FIG. 26 illustrates an outer appearance of a tablet personal computer 240. The tablet personal computer 240 may include, for example, a touch panel section 241 and a casing 242; the display unit of any of the foregoing embodiments may be mounted on the touch panel section 241.

Figure 27:
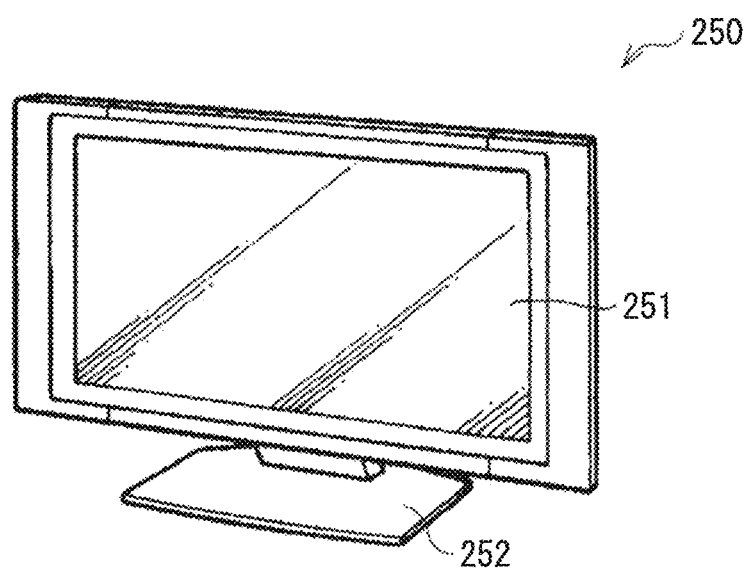
FIG. 27 is a perspective view of a configuration of a television.

FIG. 27 illustrates an outer appearance of a television 250. The television 250 may include, for example, a main body section 251 and a stand 252. The display unit of any of the foregoing embodiments may be mounted on the main body section 251.

Figure 28A:
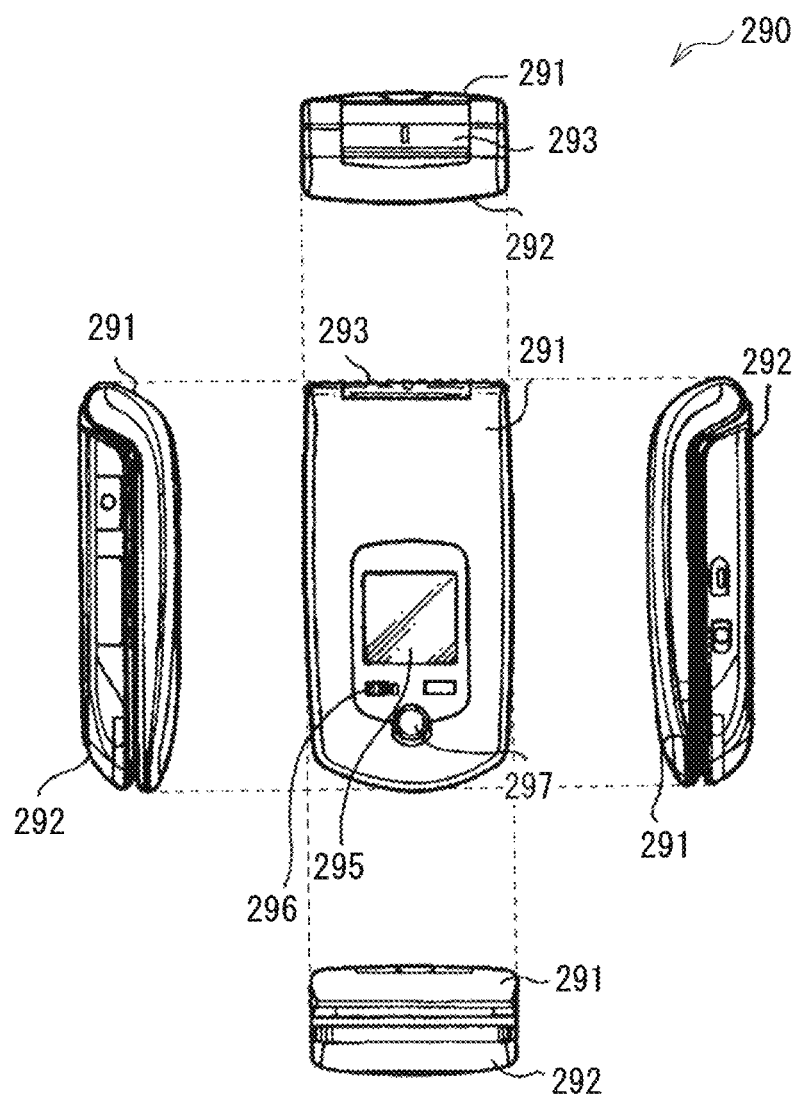
FIG. 28A is a plan view of a configuration of a mobile phone.
Figure 28B:
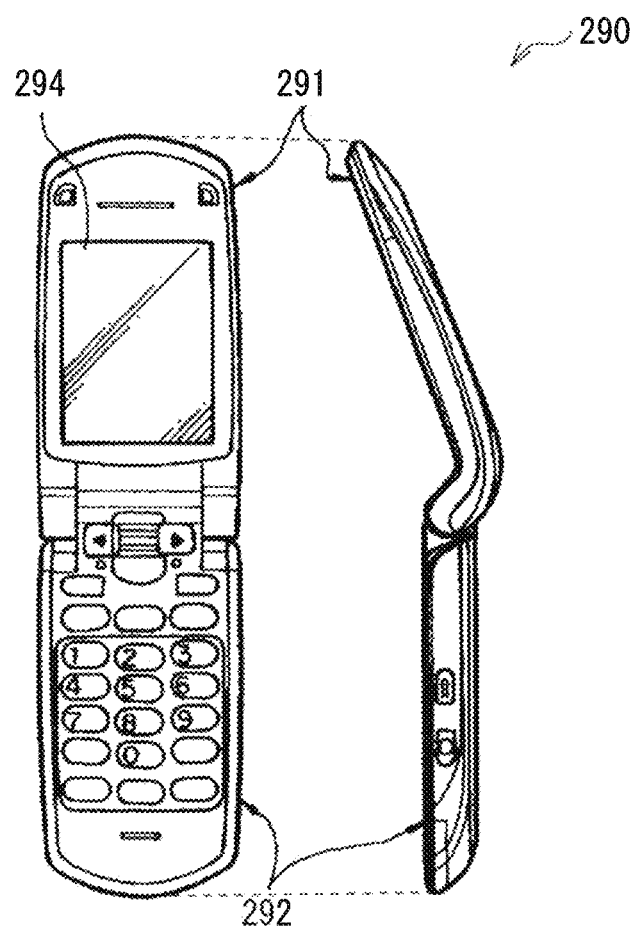
FIG. 28B is a plan view of a configuration of the mobile phone.

FIGS. 28A and 28B illustrate outer appearances of a mobile phone 290. The mobile phone 290 may include, for example, an upper casing 291 and a lower casing 292 joined together with a joining section (hinge section) 293, and may further include a display 294, a sub-display 295, a picture light 296, and a camera 297. The display unit of any of the foregoing embodiments may be mounted on the display 294 or the sub-display 295.

Figure 29A:
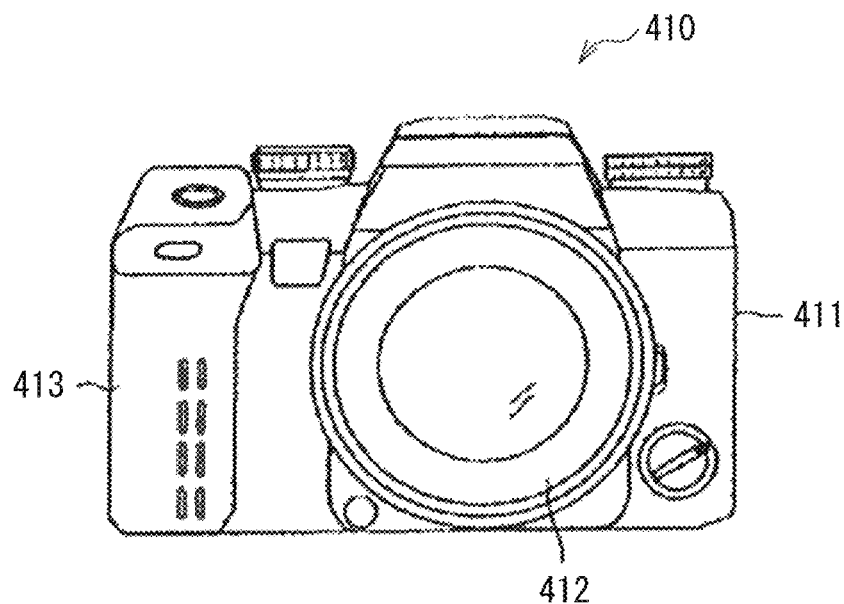
FIG. 29A is a front view of a configuration of a digital single-lens reflex camera.
Figure 29B:
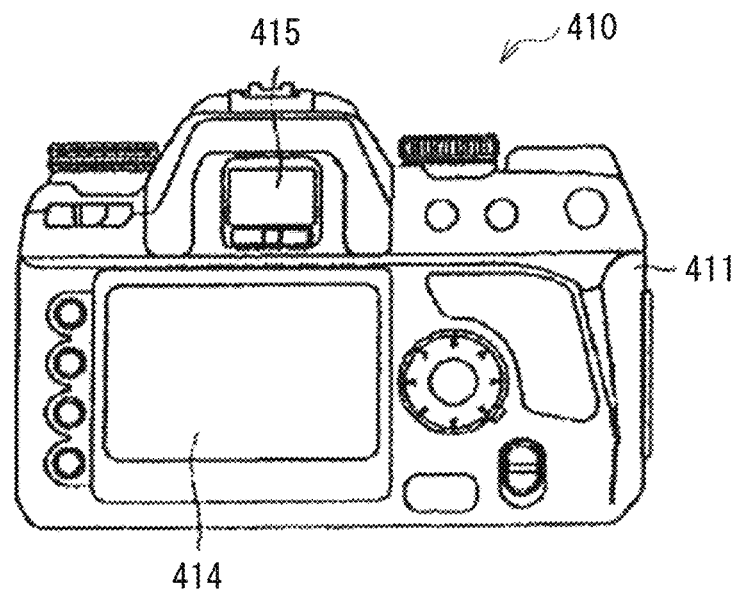
FIG. 29B is a rear view of a configuration of the digital single-lens reflex camera.

FIGS. 29A and 29B illustrate outer appearances of a digital single-lens reflex camera 410. The digital single-lens reflex camera 410 may include, for example, a main body 411, a lens 412, a grip 413, a display section 414, and a view finder 415. The display unit of any of the foregoing embodiments may be mounted on the display section 414 or the view finder 415.

Figure 30:
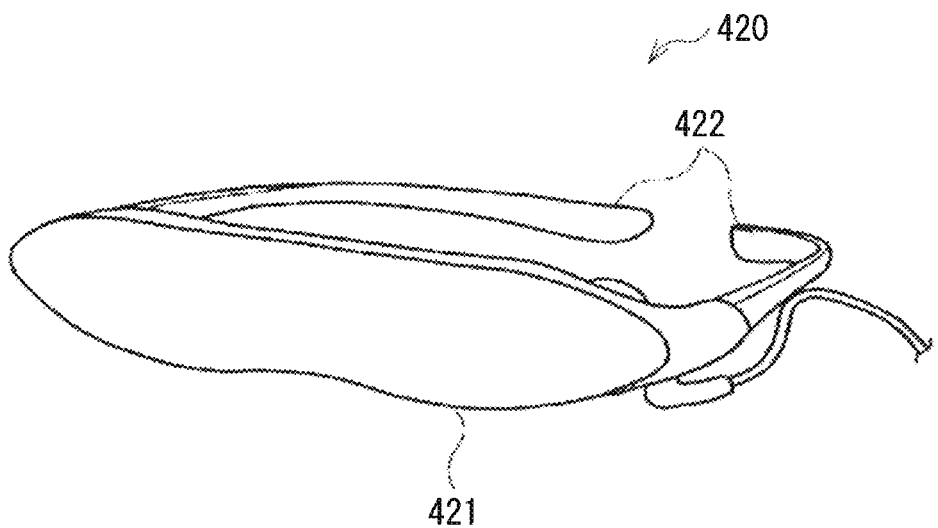
FIG. 30 is a perspective view of a configuration of a head-mounted display.

FIG. 30 illustrates an outer appearance of a head-mounted display 420. The head-mounted display 420 may include, for example, a glass-shaped display section 421 and a support section 422. The display unit of any of the foregoing embodiments may be mounted on the display section 421.

Figure 31A:
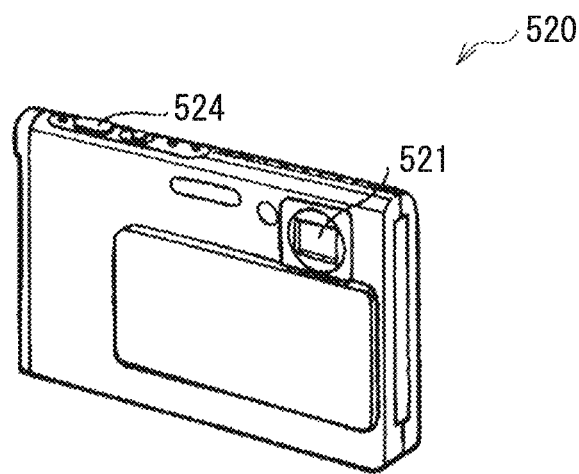
FIG. 31A is a front view of a configuration of a digital still camera.
Figure 31B:
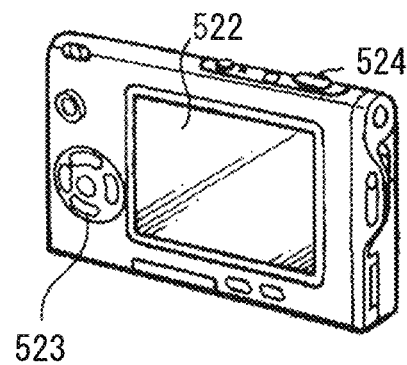
FIG. 31B is a rear view of a configuration of the digital still camera.

FIGS. 31A and 31B illustrate outer appearances of a digital still camera 520. The digital still camera 520 may include, for example, a flashlight-emitting section 521, a display section 522, a menu switch 523, and a shutter release button 524. The display unit of any of the foregoing embodiments may be mounted on the display section 522.

Figure 32:
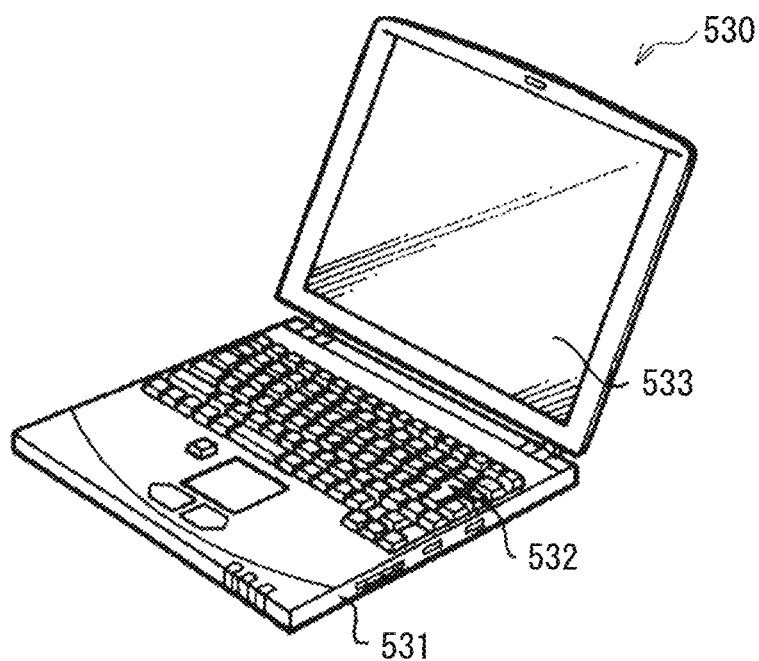
FIG. 32 is a perspective view of a configuration of a notebook personal computer.

FIG. 32 illustrates an outer appearance of a notebook personal computer 530. The notebook personal computer 530 may include, for example, a main body 531, a keyboard 532 for operation of inputting characters, for example, and a display section 533 for displaying an image. The display unit of any of the foregoing embodiments may be mounted on the display section 533.

Figure 33:
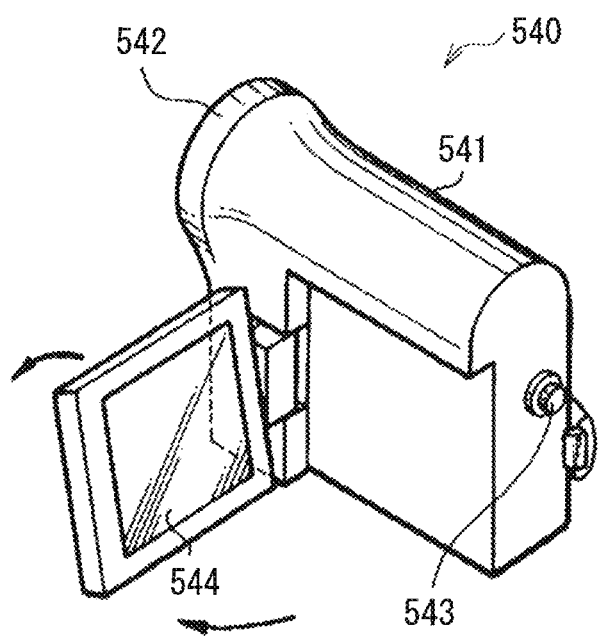
FIG. 33 is a perspective view of a configuration of a video camera.

FIG. 33 illustrates an outer appearance of a video camera 540. The video camera 540 may include, for example, a main body 541, a subject-shooting lens 542 provided on a front side surface of the main body 541, a shooting start/stop switch 543, and a display section 544. The display unit of any of the foregoing embodiments may be mounted on the display section 544.

Although description has been given of the foregoing embodiments and the modification example, the disclosure is by no means limited to the foregoing embodiments, modification example, and application examples, and various modifications are possible. For example, a reverse bias voltage may be applied only to a selective region that is a dark spot target during the repairing operation; however, this is not limitative. Alternatively, the reverse bias voltage may also be applied to a region with a wider range including the dark spot portion. The latter method is advantageous in mass production because of the shortened period of time necessary for the repairing operation. It is to be noted that the latter method also involves applying the reverse bias voltage to a normal portion; however, it becomes possible to enjoy only the effect of an improved repairing rate by properly controlling the application conditions.

The foregoing embodiments, modification example, and application examples exemplify the case where the second electrode 17 has a two-layered structure or a three-layered structure; however, the second electrode 17 may also be a multi-layered film of four layers or more including yet another film.

The material and thickness of each layer are not limited to those listed in the foregoing embodiments, modification example, and application examples; each layer may be made of any other material with any other thickness. It is not necessary for the display unit to include all of the above-described layers; alternatively, yet another layer may also be included in addition to each of the above-described layers. It is to be noted that the effects described in the foregoing embodiments, modification example, and application examples are mere examples, and the effects of the disclosure may be other different effects, or may further include other effects.

It is to be noted that the disclosure may also have the following configurations.

(1)

A display unit including:

a first electrode;

an organic layer including a light-emitting layer; and a second electrode, the first electrode, the organic layer, and the second electrode being provided in this order on a substrate, the second electrode including, in order from the organic layer, a first electrically conductive film that is transparent and includes an insulated or ablated local part, a high-resistivity layer having higher electric resistance than the first electrically conductive film, and a second electrically conductive film provided on the high-resistivity layer.

(2)

The display unit according to (1), wherein the second electrically conductive film includes a transparent electrically conductive film that is thicker than the first electrically conductive film.

(3)

The display unit according to (1) or (2), wherein the second electrode includes a third electrically conductive film that is semitransparent and provided between the organic layer and the first electrically conductive film.

(4)

The display unit according to any one of (1) to (3), further including a plurality of pixels that are arranged two-dimensionally, wherein a first portion corresponding to at least a portion of a region among the pixels is selectively removed in the high-resistivity layer, and the first electrically conductive film and the second electrically conductive film are electrically coupled to each other through the first portion.

(5)

The display unit according to any one of (1) to (4), wherein the high-resistivity layer has an electric resistance in a range from $1.0 \times 10^4$ Ω·cm to $1.0 \times 10^6$ Ω·cm.

(6)

The display unit according to any one of (1) to (5), wherein the first electrically conductive film has a thickness in a range from 1 nm to 100 nm.

(7)

The display unit according to (2), wherein the second electrically conductive film has a thickness in a range from 100 nm to 2,000 nm.

(8)

The display unit according to (3), wherein the third electrically conductive film has a thickness in a range from 1 nm to 20 nm.

(9)

The display unit according to (2) or (7), further including a plurality of pixels that are arranged two-dimensionally, wherein the second electrode includes a wiring line layer, the wiring line layer being formed to extend in a region among the pixels and having a stripe shape or a lattice shape in a plan view.

(10)

The display unit according to (2), (7), or (9), further including a protective film provided on the second electrode.

(11)

A method of manufacturing a display unit, the method including:
forming a first electrode;
forming an organic layer including a light-emitting layer; and
forming a second electrode, the first electrode, the organic layer, and the second electrode being formed in this order on a substrate, the forming of the second electrode including
  forming a first electrically conductive film that is transparent,
  applying a reverse bias between the first electrode and the first electrically conductive film to repair a dark spot portion after the forming of the first electrically conductive film,
  forming, on the first electrically conductive film with the dark spot portion being repaired, a high-resistivity layer having higher electric resistance than the first electrically conductive film, and
  forming a second electrically conductive film on the high-resistivity layer.

(12)

The method of manufacturing the display unit according to (11), wherein the second electrically conductive film includes a transparent electrically conductive film that is thicker than the first electrically conductive film.

(13)

The method of manufacturing the display unit according to (11) or (12), wherein
the forming of the second electrode includes forming a third electrically conductive film that is semitransparent before the forming of the first electrically conductive film,
the forming of the second electrode is followed by forming a protective film on the second electrode, and
the forming of the protective film is followed by performing laser light irradiation to repair the dark spot portion.

(14)

The method of manufacturing the display unit according to any one of (11) to (13), wherein
the display unit includes a plurality of pixels that are arranged two-dimensionally, and
the second electrode includes a wiring line layer, the wiring line layer being formed to extend in a region among the pixels and having a stripe shape or a lattice shape in a plan view.

(15)

A display unit including:
a first electrode;
an organic layer including a light-emitting layer; and
a second electrode, the first electrode, the organic layer, and the second electrode being provided in this order on a substrate, the second electrode including, in order from the organic layer,
  a first electrically conductive film that is transparent and includes an insulated or ablated local part, and
  a wiring line layer provided on the first electrically conductive film.

(16)

The display unit according to (15), further including a plurality of pixels that are arranged two-dimensionally, wherein the wiring line layer is formed to extend in a region among the pixels and has a stripe shape or a lattice shape in a plan view.

(17)

The display unit according to (15) or (16), wherein the second electrode includes a third electrically conductive film that is semitransparent and provided between the organic layer and the first electrically conductive film.

(18)

A method of manufacturing a display unit, the method including:
forming a first electrode;
forming an organic layer including a light-emitting layer; and
forming a second electrode, the first electrode, the organic layer, and the second electrode being formed in this order on a substrate, the forming of the second electrode including
  forming a first electrically conductive film that is transparent,
  applying a reverse bias between the first electrode and the first electrically conductive film to repair a dark spot portion after the forming of the first electrically conductive film, and
  forming a wiring line layer after the repair of the dark spot portion.

(19)

The method of manufacturing the display unit according to (18), wherein
the forming of the second electrode includes forming a third electrically conductive film that is semitransparent before the forming of the first electrically conductive film,
the forming of the second electrode is followed by forming a protective film on the second electrode, and
the forming of the protective film is followed by performing laser light irradiation to repair the dark spot portion.

(20)

A method of manufacturing a display unit, the method including:
forming a first electrode;
forming an organic layer including a light-emitting layer; and
forming a second electrode, the first electrode, the organic layer, and the second electrode being formed in this order on a substrate, the forming of the second electrode including
  forming a third electrically conductive film that is semitransparent,
  forming a first electrically conductive film that is transparent after the forming of the third electrically conductive film, and
  applying a reverse bias between the first electrode and the third electrically conductive film or between the first electrode and the first electrically conductive film either before or after, or both before and after the forming of the first electrically conductive film to repair a dark spot portion, wherein
the forming of the second electrode is followed by forming a protective film on the second electrode, and
the forming of the protective film is followed by performing laser light irradiation to repair the dark spot portion.

In the first display unit according to the embodiment of the disclosure, the transparent first electrically conductive film in the second electrode includes the insulated or ablated local part. This insulated or ablated local part electrically cuts the short path caused by a foreign matter. By stacking the second electrically conductive film on the first electrically conductive film with the high-resistivity layer being interposed therebetween, it becomes possible to allow the second electrode to have lower resistance without increasing the thickness of the first electrically conductive film, thus enabling voltage drop to be easily suppressed. Further, the interposing of the high-resistivity layer suppresses occurrence of another short circuit that may occur when the second electrically conductive film is stacked adjacently on the first electrically conductive film. The short path caused by the foreign matter is reduced while suppressing the voltage drop in the second electrode, thus alleviating the influence of the so-called dark spot on display image quality.

In the first method of manufacturing the display unit according to the embodiment of the disclosure, the forming of the second electrode includes forming the first electrically conductive film that is transparent, and thereafter applying a reverse bias between the first electrode and the first electrically conductive film. This allows heat generation to occur due to a reverse bias current near a foreign matter in the first electrically conductive film, causing the first electrically conductive film to be locally insulated or partially blown off (ablated), which leads to repair of the dark spot portion. By forming the second electrically conductive film on the first electrically conductive film with the high-resistivity layer being interposed therebetween, it becomes possible to allow the second electrode to have lower resistance without increasing the thickness of the first electrically conductive film, thus enabling voltage drop to be easily suppressed. Further, the interposing of the high-resistivity layer suppresses occurrence of another short circuit that may occur near the foreign matter when the second electrically conductive film is stacked adjacently on the first electrically conductive film. The short path caused by the foreign matter is reduced while suppressing the voltage drop in the second electrode, thus alleviating the influence of the so-called dark spot on display image quality.

In the second display unit according to the embodiment of the disclosure, the transparent first electrically conductive film in the second electrode includes the insulated or ablated local part. This insulated or ablated local part electrically cuts the short path caused by a foreign matter. By stacking the wiring line layer on the first electrically conductive film, it becomes possible to allow the second electrode to have lower resistance without increasing the thickness of the first electrically conductive film, thus enabling voltage drop to be easily suppressed. The short path caused by the foreign matter is reduced while suppressing the voltage drop in the second electrode, thus alleviating the influence of the so-called dark spot on display image quality.

In the second method of manufacturing the display unit according to the embodiment of the disclosure, the forming of the second electrode includes forming the first electrically conductive film that is transparent, and thereafter applying a reverse bias between the first electrode and the first electrically conductive film. This allows heat generation to occur due to a reverse bias current near a foreign matter in the first electrically conductive film, causing the first electrically conductive film to be locally insulated or partially blown off (ablated), which leads to repair of the dark spot portion. By forming the wiring line layer on the first electrically conductive film, it becomes possible to allow the second electrode to have lower resistance without increasing the thickness of the first electrically conductive film, thus enabling voltage drop to be easily suppressed. The short path caused by the foreign matter is reduced while suppressing the voltage drop in the second electrode, thus alleviating the influence of the so-called dark spot on display image quality.

In the third method of manufacturing the display unit according to the embodiment of the disclosure, the forming of the second electrode includes applying a reverse bias between the first electrode and the third electrically conductive film or between the first electrode and the first electrically conductive film either before or after, or both before and after the forming of the first electrically conductive film. This allows heat generation to occur due to a reverse bias current near a foreign matter in the third electrically conductive film (or in the first electrically conductive film), causing the third electrically conductive film (or the first electrically conductive film) to be locally insulated or partially blown off (ablated), which leads to repair of the dark spot portion. Further, the laser light irradiation after the forming of the second electrode and the protective film allows for another repair of the dark spot portion. The two-time dark spot repairs make it possible to repair, with the second dark spot repair, a portion that is insufficient in insulation of the local part in the first repair (the dark spot repair by the reverse bias application) even when there is such a portion, thus allowing the dark spot portion to be repaired more securely. Further, forming the first electrically conductive film on the third electrically conductive film in the second electrode is more advantageous in lowering resistance than the case of using the first electrically conductive film or the third electrically conductive film as a monolayer, thus leading to suppression of voltage drop. The short path caused by the foreign matter is reduced while suppressing the voltage drop in the second electrode, thus alleviating the influence of the so-called dark spot on display image quality.

In the first display unit and the first method of manufacturing the display unit according to the embodiments of the disclosure, the second electrically conductive film is provided, in the second electrode, on the first electrically conductive film that is transparent and includes an insulated or ablated local part. Therefore, it becomes possible to reduce the short path caused by the foreign matter while allowing the second electrode to have lower resistance. Further, the interposing of the high-resistivity layer enables suppression of the occurrence of another short circuit. It is possible to alleviate the influence of the dark spot on display image quality while suppressing the voltage drop in the second electrode. Thus, it becomes possible to suppress deterioration of the display image quality.

In the second display unit and the second method of manufacturing the display unit according to the embodiments of the disclosure, the wiring line layer is provided, in the second electrode, on the first electrically conductive film that is transparent and includes an insulated or ablated local part. Therefore, it becomes possible to alleviate the influence of the dark spot on display image quality while suppressing the voltage drop in the second electrode. Thus, it becomes possible to suppress deterioration of the display image quality.

In the third method of manufacturing the display unit according to the embodiment of the disclosure, the forming of the second electrode includes stacking the first electrically conductive film on the third electrically conductive film and applying a predetermined reverse bias to repair the dark spot, and the forming of the second electrode is followed by another dark spot repair. This makes it possible to alleviate the influence of the dark spot on display image quality while suppressing the voltage drop in the second electrode. Thus, it becomes possible to suppress deterioration of the display image quality.

It is to be noted that the foregoing technical contents are mere examples of the disclosure. The effects according to an embodiment of the disclosure are not limited to those described above. The disclosure may have effects different from those described above, or may further have other effects in addition to those described above.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "about" as used herein can allow for a degree of variability in a value or range. Moreover, no element or component in this disclosure is intended to be dedicated to the public regardless of whether the element or component is explicitly recited in the following claims.

What is claimed is:

1. A display unit comprising:
   a first electrode;
   an organic layer including a light-emitting layer;
   foreign matter mixed in the organic layer; and
   a second electrode, the first electrode, the organic layer, and the second electrode being provided in this order on a substrate, the second electrode including, in order from the organic layer,
      a first electrically conductive oxide film that is transparent and includes an insulated part in close proximity, or in contact with the foreign matter, that is formed by applying a reverse bias between the first electrically conductive oxide film and the first electrode,
      a high-resistivity layer having higher electric resistance than the first electrically conductive film, and
      a second electrically conductive film provided on the high-resistivity layer.

2. The display unit according to claim 1, wherein the second electrically conductive film includes a transparent electrically conductive film that is thicker than the first electrically conductive oxide film.

3. The display unit according to claim 2, wherein the second electrically conductive film has a thickness in a range from 100 nm to 2,000 nm.

4. The display unit according to claim 1, wherein the second electrode includes a third electrically conductive film that is semitransparent and provided between the organic layer and the first electrically conductive oxide film.

5. The display unit according to claim 4, wherein the third electrically conductive film has a thickness in a range from 1 nm to 20 nm.

6. The display unit according to claim 1, further comprising a plurality of pixels that are arranged two-dimensionally, wherein
   a first portion corresponding to at least a portion of a region among the pixels is selectively removed in the high-resistivity layer, and
   the first electrically conductive oxide film and the second electrically conductive film are electrically coupled to each other through the first portion.

7. The display unit according to claim 1, wherein the high-resistivity layer has an electric resistance in a range from $1.0 \times 10^4$ Ω·cm to $1.0 \times 10^6$ Ω·cm.

8. The display unit according to claim 1, wherein the first electrically conductive oxide film has a thickness in a range from 1 nm to 100 nm.

9. The display unit according to claim 1, further comprising a plurality of pixels that are arranged two-dimensionally, wherein the second electrode includes a wiring line layer, the wiring line layer being formed to extend in a region among the pixels and having a stripe shape or a lattice shape in a plan view.

10. The display unit according to claim 1, further comprising a protective film provided on the second electrode.

11. A display comprising:
    a first electrode;
    an organic layer including a light-emitting layer;
    foreign matter mixed in the organic layer;
    a second electrode, the first electrode, the organic layer, and the second electrode being provided in this order on a substrate, the second electrode including, in order from the organic layer,
       a first electrically conductive oxide film that is transparent and includes a granulated part in close proximity, or in contact with, the foreign matter,
       a high-resistivity layer having higher electric resistance than the first electrically conductive film, and
       a second electrically conductive film provided on the high-resistivity layer.

12. The display of claim 11, wherein the second electrically conductive film includes a transparent electrically conductive film that is thicker than the first electrically conductive oxide film.

13. The display of claim 12, wherein the second electrically conductive film has a thickness in a range from 100 nm to 2,000 nm.

14. The display of claim 11, wherein the second electrode includes a third electrically conductive film that is semitransparent and provided between the organic layer and the first electrically conductive oxide film.

15. The display of claim 14, wherein the third electrically conductive film has a thickness in a range from 1 nm to 20 nm.

16. The display of claim 11, further comprising:
    a plurality of pixels that are arranged two-dimensionally, wherein
    a first portion corresponding to at least a portion of a region among the pixels is selectively removed in the high-resistivity layer, and
    the first electrically conductive oxide film and the second electrically conductive film are electrically coupled to each other through the first portion.

17. The display of claim 11, wherein the high-resistivity layer has an electric resistance in a range from $1.0 \times 10^4$ Ω·cm to $1.0 \times 10^6$ Ω·cm.

18. The display of claim 11, wherein the first electrically conductive oxide film has a thickness in a range from 1 nm to 100 nm.

19. The display of claim 11, further comprising:
a plurality of pixels that are arranged two-dimensionally, wherein
the second electrode includes a wiring line layer, the wiring line layer being formed to extend in a region among the pixels and having a stripe shape or a lattice shape in a plan view.

20. The display of claim 11, further comprising:
a protective film provided on the second electrode.

\* \* \* \* \*